US012506014B2

(12) United States Patent
Abel

(10) Patent No.: US 12,506,014 B2
(45) Date of Patent: *Dec. 23, 2025

(54) METHODS FOR NON-ISOTHERMAL WET ATOMIC LAYER ETCHING

(71) Applicant: Tokyo Electron Limited, Tokyo (JP)

(72) Inventor: Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 637 days.

This patent is subject to a terminal disclaimer.

(21) Appl. No.: 17/835,065

(22) Filed: Jun. 8, 2022

(65) Prior Publication Data

US 2023/0117790 A1    Apr. 20, 2023

Related U.S. Application Data

(63) Continuation-in-part of application No. 17/674,579, filed on Feb. 17, 2022, now Pat. No. 11,802,342.
(Continued)

(51) Int. Cl.
*H01L 21/3213*  (2006.01)
*H01L 21/02*    (2006.01)
*H01L 21/3105*  (2006.01)

(52) U.S. Cl.
CPC .... *H01L 21/32134* (2013.01); *H01L 21/0228* (2013.01); *H01L 21/31055* (2013.01)

(58) Field of Classification Search
None
See application file for complete search history.

(56) References Cited

U.S. PATENT DOCUMENTS 5,374,328 A    12/1994    Remba et al.
6,054,333 A     4/2000    Bensaoula
(Continued)

FOREIGN PATENT DOCUMENTS

KR    1020170022922    3/2017
KR    1020170077839    7/2017
(Continued)

OTHER PUBLICATIONS

Search Report and The Written Opinion mailed Aug. 29, 2023, Application No. PCT/US2023/020568, Filed May 1, 2023, 9 pgs.
(Continued)

*Primary Examiner* — Binh X Tran
(74) *Attorney, Agent, or Firm* — Egan, Enders & Huston LLP.

(57) ABSTRACT

The present disclosure provides a non-isothermal wet atomic layer etch (ALE) process for etching polycrystalline materials, such as metals, metal oxides and silicon-based materials, formed on a substrate. More specifically, the present disclosure provides various embodiments of methods that utilize thermal cycling in a wet ALE process to independently optimize the reaction temperatures utilized within individual processing steps of the wet ALE process. Like conventional wet ALE processes, the wet ALE process described herein is a cyclic process that includes multiple cycles of surface modification and dissolution steps. Unlike conventional wet ALE processes, however, the wet ALE process described herein is a non-isothermal process that performs the surface modification and dissolution steps at different temperatures. This allows independent optimization of the surface modification and dissolution reactions.

21 Claims, 9 Drawing Sheets

Related U.S. Application Data

(60) Provisional application No. 63/257,226, filed on Oct. 19, 2021.

(56) References Cited

U.S. PATENT DOCUMENTS

| | | | |
|---|---|---|---|
| 6,335,294 B1 | 1/2002 | Agnello et al. | |
| 6,616,014 B1 | 9/2003 | Pozniak et al. | |
| 6,805,769 B2 | 10/2004 | Okuda et al. | |
| 6,841,031 B2 | 1/2005 | Iwata et al. | |
| 6,896,600 B1 | 5/2005 | Wu et al. | |
| 7,582,181 B2 | 9/2009 | Babic | |
| 9,953,826 B2 | 4/2018 | Kaneko et al. | |
| 10,157,756 B2 | 12/2018 | Yamada | |
| 10,784,175 B2 | 9/2020 | Clark | |
| 10,861,744 B2 | 12/2020 | Trickett et al. | |
| 10,982,335 B2 | 4/2021 | Abel | |
| 11,802,342 B2 * | 10/2023 | Abel | C23G 1/20 |
| 2002/0004303 A1 | 1/2002 | Agnello | |
| 2003/0087528 A1 | 5/2003 | Kruwinus | |
| 2006/0289389 A1 | 12/2006 | Shea | |
| 2009/0007938 A1 | 1/2009 | Dubreuil et al. | |
| 2009/0047790 A1 | 2/2009 | Raghu et al. | |
| 2010/0279435 A1 | 11/2010 | Xu et al. | |
| 2011/0094888 A1 | 4/2011 | Chen et al. | |
| 2012/0031768 A1 | 2/2012 | Reid et al. | |
| 2014/0199840 A1 | 7/2014 | Bajaj et al. | |
| 2014/0370643 A1 | 12/2014 | Stern et al. | |
| 2016/0089686 A1 | 3/2016 | Lee et al. | |
| 2016/0141210 A1 | 5/2016 | Lei et al. | |
| 2016/0372320 A1 | 12/2016 | Emoto | |
| 2017/0194196 A1 | 7/2017 | Brink et al. | |
| 2017/0356084 A1 | 12/2017 | Nakanishi et al. | |
| 2018/0061675 A1 | 3/2018 | Heehwan et al. | |
| 2018/0090352 A1 | 3/2018 | Sotoku et al. | |
| 2018/0226278 A1 | 8/2018 | Arnepalli et al. | |
| 2018/0374936 A1 | 12/2018 | Kelly et al. | |
| 2019/0011734 A1 | 1/2019 | Otsuji | |
| 2019/0027383 A1 | 1/2019 | Nakal et al. | |
| 2019/0148192 A1 | 5/2019 | Yamaguchi | |
| 2019/0295846 A1 | 9/2019 | Clark et al. | |
| 2020/0161148 A1 * | 5/2020 | Abel | C23F 1/08 |
| 2020/0312620 A1 | 10/2020 | Blomberg et al. | |
| 2020/0377792 A1 * | 12/2020 | Guske | C09K 15/30 |
| 2021/0104414 A1 * | 4/2021 | Panagopoulos ... | H01L 21/67115 |
| 2021/0175088 A1 * | 6/2021 | Dezelah | C23F 1/12 |

FOREIGN PATENT DOCUMENTS

| | | |
|---|---|---|
| WO | 2017099718 | 6/2017 |
| WO | WO-2017099718 A1 * | 6/2017 |
| WO | 2018004649 | 1/2018 |

OTHER PUBLICATIONS

International Search Report issued in Application No. PCT/US2019/061683, Mar. 13, 2020, 9 pgs.
International Search Report Issued in Application No. PCT/US2019/061678, Mar. 13, 2020, 8 pgs.
Kern, "The Evolution Of Silicon Wafer Cleaning Technology", J. Electrochem. Soc., vol. 137, No. 6, Jun. 1990, 7 pgs.
Kern, "RCA Critical Cleaning Process", Microtech Systems, Inc., 2007, 7 pgs.
Wikipedia, "RCA Clean", Apr. 2022, 3 pgs.
Virginia Semiconductor, Inc., "Wet-Chemical Etching and Cleaning of Silicon", Jan. 2003, 11 pgs.

\* cited by examiner

METHODS FOR NON-ISOTHERMAL WET ATOMIC LAYER ETCHING

This application is a continuation-in-part (CIP) of U.S. patent application Ser. No. 17/674,579, filed Feb. 17, 2022, entitled "Methods for Wet Atomic Layer Etching of Ruthenium," which claims priority to U.S. Provisional Patent Application Ser. No. 63/257,226, filed Oct. 19, 2021, entitled "METHOD FOR WET ATOMIC LAYER ETCHING OF RUTHENIUM"; the disclosure of which is expressly incorporated herein, in its entirety, by reference.

This application is related to, commonly owned U.S. patent application Ser. No. 17/725,072, filed Apr. 20, 2022, entitled "Methods for Wet Atomic Layer Etching of Copper," the disclosure of which is expressly incorporated herein, in its entirety, by reference.

BACKGROUND

This disclosure relates to semiconductor device manufacturing, and, in particular, to the removal and etching of polycrystalline materials, such as metals, formed on a substrate. More specifically, the disclosure relates to the process of wet atomic layer etching (ALE) of polycrystalline materials.

During routine semiconductor fabrication, various metals formed on a substrate may be removed by patterned etching, chemical-mechanical polishing, as well as other techniques. A variety of techniques are known for etching layers on a substrate, including plasma-based or vapor phase etching (otherwise referred to as dry etching) and liquid based etching (otherwise referred to as wet etching). Wet etching generally involves dispensing a chemical solution over the surface of a substrate or immersing the substrate in the chemical solution. The chemical solution often contains a solvent, chemicals designed to react with materials on the substrate surface and chemicals to promote dissolution of the reaction products. As a result of exposure of the substrate surface to the etchant, material is removed from the substrate. Etchant composition and temperature may be controlled to control the etch rate, specificity, and residual material on the surface of the substrate post-etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless of crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one or a few monolayers of material at a time. ALE processes generally rely on a chemical modification of the surface to be etched followed by selective removal of the modified surface layer. Thus, ALE processes offer improved performance by decoupling the etch process into sequential steps of surface modification and selective removal of the modified surface layer. In some embodiments, an ALE process may include multiple cyclic series of surface modification and etch steps, where the modification step modifies the exposed surfaces and the etch step selectively removes the modified surface layer. In such processes, a series of self-limiting reactions may occur and the cycle may be repeatedly performed until a desired or specified etch amount is achieved. In other embodiments, an ALE process may use just one cycle.

A variety of ALE processes are known in the art, including plasma ALE, thermal ALE and wet ALE techniques. Like all ALE processes, wet ALE is typically a cyclic process that uses sequential, self-limiting reactions to chemically modify an exposed surface of a material to form a modified surface layer and selectively remove the modified surface layer from the surface. Unlike thermal and plasma ALE techniques, however, the reactions used in wet ALE primarily take place in the liquid phase.

For example, a wet ALE process may generally begin with a surface modification step, which exposes a material to be etched to a first solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. Ideally, the dissolution step will selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

In conventional ALE processes, the surface modification and etch steps are usually performed at the same temperature, resulting in an isothermal etch process. In conventional wet ALE processes, for example, the surface modification and dissolution steps are often performed at (or near) room temperature. This is usually considered to be an advantage of wet ALE over other ALE techniques. In plasma and thermal ALE processes, the surface modification and etch steps are often performed at a higher temperature than is typically used for wet ALE. Like wet ALE, however, plasma and thermal ALE are typically isothermal processes. Because adjusting and reaching thermal equilibrium at each cycle is too time-consuming, plasma and thermal ALE processes must be conducted isothermally to meet the throughput requirements of high volume manufacturing.

SUMMARY

The present disclosure provides a non-isothermal wet atomic layer etch (ALE) process for etching polycrystalline materials, such as metals, metal oxides and silicon-based materials, formed on a substrate. More specifically, the present disclosure provides various embodiments of methods that utilize thermal cycling in a wet ALE process to independently optimize the reaction temperatures utilized within individual processing steps of the wet ALE process. Like conventional wet ALE processes, the wet ALE process described herein is a cyclic process that includes multiple cycles of surface modification and dissolution steps. Unlike conventional wet ALE processes, however, the wet ALE process described herein is a non-isothermal process that performs the surface modification and dissolution steps at different temperatures. This allows independent optimization of the surface modification and dissolution reactions.

The non-isothermal wet ALE process described herein may generally include multiple ALE cycles, where each ALE cycle includes a surface modification step, a first purge step, a dissolution step and a second purge step, and where one or more of these processing steps is performed at a different temperature. In some embodiments, thermal cycling can be introduced as part of the wet ALE process described herein by dispensing liquid solutions utilized within one or more of the processing steps at a different temperature. The high heat capacity of the liquid solutions, combined with their high convective heat transfer coefficients, allows the substrate surface to reach thermal equilibration quickly, thus allowing the temperature of the substrate to be changed within the timescale of a single ALE cycle.

In some embodiments, the non-isothermal wet ALE process described herein may dispense a surface modification solution onto a surface of a substrate at a first temperature, and may subsequently dispense a dissolution solution onto the surface of the substrate at a second temperature, which is different from the first temperature. The first temperature and the second temperature may be selected to independently optimize the reactions that occur during the surface modification and dissolution steps. In some embodiments, for example, the surface modification solution may be dispensed at a first temperature, which is less than or equal to room temperature (e.g., a temperature less than or equal to 25° C.). However, the dissolution solution may be dispensed at a second temperature, which is greater than room temperature (e.g., a temperature greater than or equal to 40° C.) to optimize the kinetics of the dissolution reaction. By utilizing liquid solutions having substantially different temperatures, the wet ALE process described herein provides a cyclic, non-isothermal etch process, which repeatedly adjusts the reaction temperatures of the surface modification and dissolution steps to independently optimize the surface modification and dissolution reactions.

During each ALE cycle, purge solutions may be dispensed onto the surface of the substrate between the surface modification and dissolution steps to remove the surface modification and dissolution solutions from the surface of the substrate. In some embodiments, the purge solutions may be utilized to pre-heat or pre-cool the substrate prior to performing the next processing step. After performing a surface modification step, for example, a heated purge solution may be dispensed onto the surface of the substrate to bring the temperature of the substrate closer to the second temperature (i.e., the desired dissolution reaction temperature) prior to performing the next dissolution step. After the dissolution step is performed, a room temperature (or cooled) purge solution may be dispensed onto the surface of the substrate to bring the temperature of the substrate closer to the first temperature (i.e., the desired surface modification reaction temperature) prior to performing the next surface modification step. By using the temperature and thermal mass of the purge solutions, the wet ALE process described herein is able to quickly adjust the surface of the substrate to the next process temperature.

Accordingly, a cyclic, non-isothermal wet ALE process is disclosed herein for etching polycrystalline materials. By utilizing heated (and/or cooled) liquid solutions, the cyclic, non-isothermal wet ALE process described herein quickly adjusts the reaction temperatures of the surface modification and dissolution steps within the timescale of a single ALE cycle to independently optimize the surface modification and dissolution reactions. The disclosed non-isothermal wet ALE process is able to change the substrate temperature, during processing, much easier and faster than can be achieved in the gas-phase processing used in plasma and thermal ALE. Accordingly, the disclosed non-isothermal wet ALE process is suitable for high volume manufacturing.

As noted above and described further herein, the present disclosure provides various embodiments of methods that utilize thermal cycling in a wet ALE process to independently optimize the reaction temperatures utilized within the individual processing steps of the wet ALE process. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to one embodiment, a method is provided herein for etching a polycrystalline material using a non-isothermal wet atomic layer etching (ALE) process. The method may generally include receiving a substrate having a polycrystalline material formed thereon, wherein a surface of the polycrystalline material is exposed on a surface of the substrate, and dispensing a surface modification solution onto the surface of the substrate at a first temperature, wherein the surface modification solution chemically modifies the surface of the polycrystalline material to form a passivation layer on the surface of the polycrystalline material. Next, the method may include removing the surface modification solution from the surface of the substrate subsequent to forming the passivation layer, and dispensing a dissolution solution onto the surface of the substrate at a second temperature, which is different from the first temperature, wherein the dissolution solution selectively removes the passivation layer from the surface of the polycrystalline material. Next, the method may include removing the dissolution solution from the surface of the substrate, and repeating the steps of dispensing the surface modification solution, removing the surface modification solution, dispensing the dissolution solution, and removing the dissolution solution a number of ALE cycles until a predetermined amount of the polycrystalline material is removed from the substrate.

As noted above, the first temperature and the second temperature may be selected so as to independently optimize the reactions that occur during the surface modification and dissolution steps of the non-isothermal wet ALE process described herein. In some embodiments, the surface modification solution may be dispensed within a first temperature range having a lower limit that is set by the freezing point of the surface modification solution and an upper limit of approximately room temperature (e.g., a temperature ranging between 20° C. and 25° C.). In one example embodiment, the surface modification solution may be dispensed at approximately room temperature (e.g., a temperature ranging between 20° C. and 25° C.). In some embodiments, the dissolution solution may be dispensed at a second temperature, which is greater than the first temperature to optimize the kinetics of the dissolution reaction. For example, the dissolution solution may be dispensed within a second temperature range having a lower limit of 40° C. and an upper limit that is set by the boiling point of the dissolution etch solution. In one example embodiment, the dissolution solution may be dispensed within a second temperature range comprising 40° C. to 337° C.

In some embodiments, said removing the surface modification solution may include dispensing a first purge solution onto the surface of the substrate to remove the surface modification solution from the surface of the substrate prior to dispensing the dissolution solution. In some embodiments, a temperature of the first purge solution may bring a temperature of the substrate closer to the second temperature before the dissolution solution is dispensed. In some embodiments, the temperature of the first purge solution may be within 10% of the second temperature.

In some embodiments, said removing the dissolution solution may include dispensing a second purge solution onto the surface of the substrate to remove the dissolution solution from the surface of the substrate before re-dispensing the surface modification solution during a subsequent ALE cycle. In some embodiments, a temperature of the second purge solution may bring a temperature of the substrate closer to the first temperature before the surface modification solution is re-dispensed during the subsequent ALE cycle. In some embodiments, the temperature of the second purge solution may be within 10% of the first temperature.

Different etch chemistries may be used within the surface modification and the dissolution solutions for etching a wide variety of polycrystalline materials, such as metals, metal oxides silicon-based materials. Examples of metals that may be etched using the methods disclosed herein include, but are not limited to, ruthenium (Ru), cobalt (Co), copper (Cu), molybdenum (Mo), tungsten (W), gold (Au), platinum (Pt), iridium (Ir) and other transition metals. Example of metal oxides that may be etched using the methods disclosed herein include, but are not limited to, aluminum oxide ($Al_2O_3$), hafnium oxide ($HfO_2$). In some embodiments, the methods disclosed herein may also be used to etch silicon-based materials, such as but not limited to, silicon (Si), silicon oxides (e.g., SiO and $SiO_2$) and silicon nitrides (e.g., $Si_3N_4$). Although various examples are provided herein, one skilled in the art would recognize how the methods disclosed herein may be used to etch other metals, metal oxides and silicon-based materials. Example etch chemistries for etching ruthenium and molybdenum using the non-isothermal wet ALE techniques disclosed herein are discussed in more detail below.

In some embodiments, the method disclosed herein may be used for etching a ruthenium (Ru) surface. When the method disclosed herein is utilized for etching a ruthenium surface, the surface modification solution may include a halogenation agent (e.g., a chlorination agent, a fluorinating agent or a brominating agent) dissolved in a first solvent, and the dissolution solution may include a ligand dissolved in a second solvent. The halogenation agent included within the surface modification solution chemically modifies the ruthenium surface to form a halogenated ruthenium passivation layer. The ligand included within the dissolution solution reacts with and binds to the halogenated ruthenium passivation layer to form a soluble species, which is dissolved within the second solvent to selectively remove the halogenated ruthenium passivation layer from the ruthenium surface. In some embodiments, the surface modification solution may be dispensed at a first temperature ranging between 20° C. and 25° C., and the dissolution solution may be dispensed at a second temperature ranging between 40° C. and 100° C.

In other embodiments, the method disclosed herein may be used for etching a molybdenum (Mo) surface. When the method disclosed herein is utilized for etching a molybdenum surface, the surface modification solution may include an oxidation agent and a first ligand dissolved in a first solvent, and the dissolution solution may include a second ligand dissolved in a second solvent. The oxidation agent oxidizes the molybdenum surface to form a molybdenum oxide passivation layer. The first ligand included within the surface modification solution reacts with and binds to the molybdenum oxide passivation layer to form a ligand-metal complex, which is insoluble in the first solvent. When exposed to the dissolution solution, a ligand exchange process exchanges the first ligand in the ligand-metal complex with the second ligand included within the dissolution solution to form a soluble species, which is dissolved within the second solvent to selectively remove the molybdenum oxide passivation layer from the molybdenum surface. In some embodiments, the surface modification solution may be dispensed at a first temperature ranging between 20° C. and 25° C., and the dissolution solution may be dispensed at a second temperature ranging between 40° C. and 337° C.

According to another embodiment, a method is provided herein for etching a substrate using a non-isothermal wet atomic layer etching (ALE) process. The method may generally include: a) receiving the substrate, the substrate having a ruthenium surface exposed thereon; b) exposing the ruthenium surface to a first etch solution containing a halogenating agent to chemically modify the ruthenium surface and form a ruthenium halide passivation layer, wherein the first etch solution is dispensed onto a surface of the substrate at a first temperature; c) rinsing the substrate with a first purge solution to remove the first etch solution from the surface of the substrate; d) exposing the ruthenium halide passivation layer to a second etch solution to selectively remove the ruthenium halide passivation layer without removing the ruthenium surface underlying the ruthenium halide passivation layer, wherein the second etch solution is dispensed onto the surface of the substrate at a second temperature, which is greater than the first temperature; e) rinsing the substrate with a second purge solution to remove the second etch solution from the surface of the substrate; and f) repeating steps b)-e) for one or more cycles.

In some embodiments, the first etch solution may be dispensed onto the surface of the substrate at a first temperature, which is less than or approximately equal to room temperature. In one example, the first temperature may be selected from a first temperature range comprising 20° C. to 25° C. Although the example provided is within room temperature range, the first temperature is not strictly limited to such, and may alternatively range between an upper limit of 25° C. and a lower limit that is set by the freezing point of the first etch solution. As noted above, the second etch solution may be dispensed onto the surface of the substrate at a second temperature, which is greater than the first temperature to optimize the kinetics of the dissolution reaction. In one example, the second temperature may be selected from a second temperature range comprising 40° C.

to 100° C. Like the first temperature, however, the second temperature is not strictly limited to such a temperature range, and may comprise any elevated temperature that is greater than room temperature and less than the boiling point of the second etch solution. For example, the second temperature may range between a lower limit of 40° C. and an upper limit that is set by the boiling point of the second etch solution.

In some embodiments, the first etch solution may include a chlorination agent dissolved in a first solvent. In such embodiments, the chlorination agent may react with the ruthenium surface to form a ruthenium chloride passivation layer, which is insoluble in the first solvent. For example, the chlorination agent may include trichloroisocyanuric acid (TCCA), oxalyl chloride, thionyl chloride or N-chlorosuccinimide, and the first solvent may include ethyl acetate (EA), acetone, acetonitrile, or a chlorocarbon.

In some embodiments, the second etch solution may include a ligand dissolved in a second solvent. In such embodiments, the ligand may react with and bind to the ruthenium chloride passivation layer to form a soluble species that dissolves within the second solvent. For example, the ligand may include ethylenediaminetetraacetic acid (EDTA), iminodiacetic acid (IDA), diethylenetriaminepentaacetic acid (DTPA) or acetylacetone (ACAC), and the second solvent may include a base.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
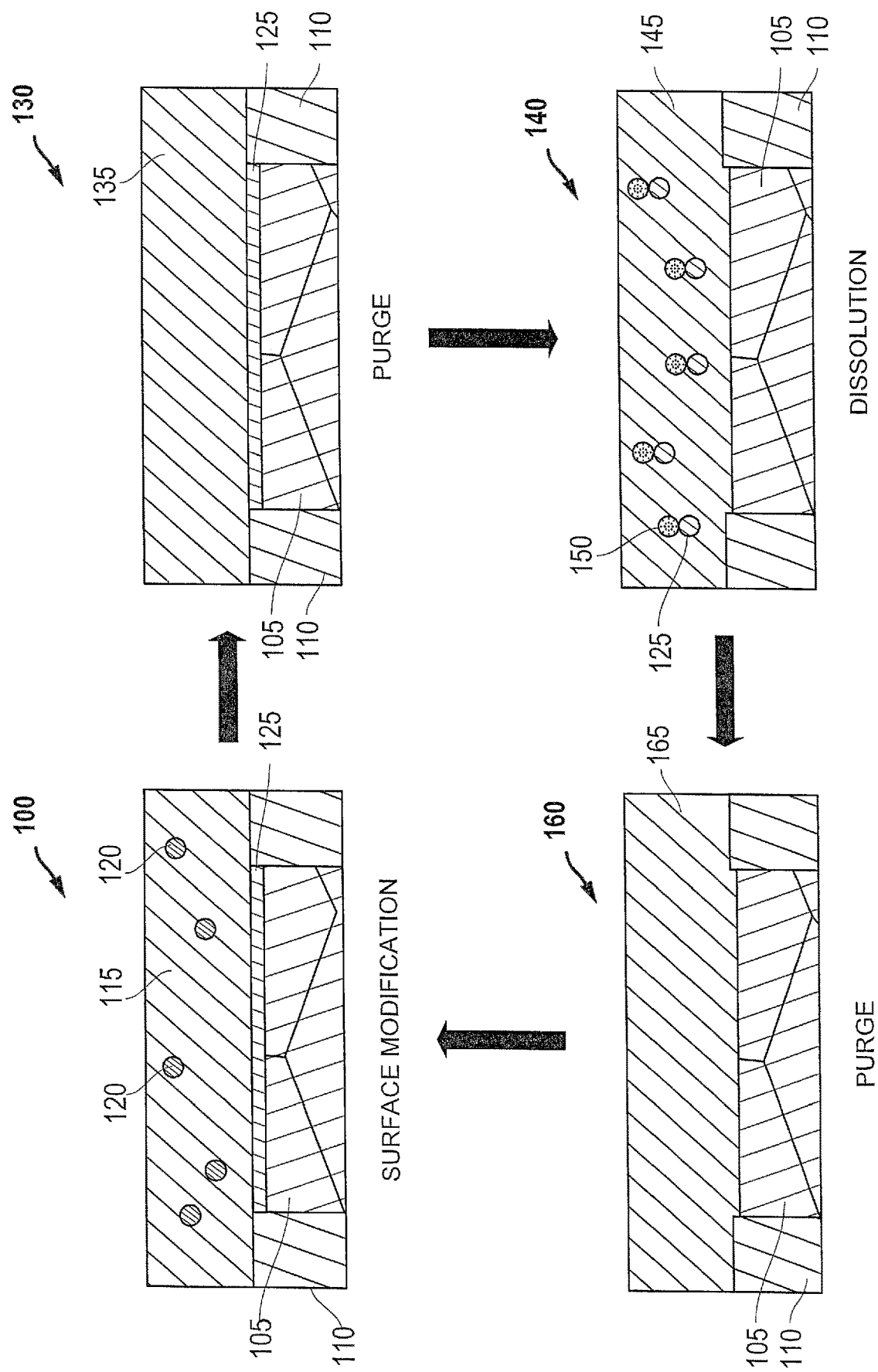
FIG. 1 illustrates one example of a cyclic, non-isothermal wet atomic layer etching (ALE) process that can be used to etch ruthenium in accordance with the present disclosure.

As noted above, conventional methods for etching polycrystalline materials are typically conducted as isothermal processes. For example, most wet ALE processes developed thus far are run isothermally at room temperature. Although plasma and thermal ALE processes may be performed at higher temperatures than is typically used for wet ALE, plasma and thermal ALE processes must be run isothermally to meet the throughput requirements of high volume manufacturing.

The present inventors recognized that, in some ALE processes, one of the reaction steps may benefit from being run at a higher temperature. For example, the present inventors recognized that increasing the temperature of the dissolution reaction may improve the kinetics of dissolution and increase the etch rate when etching some materials. However, the present inventors noted that raising the temperature for the benefit of one reaction is sometimes detrimental to the second reaction. As such, the present inventors recognized that it is not always desirable to run the entire process at an elevated temperature, and developed a non-isothermal etch process that improves upon conventional etch processes run isothermally.

In the present disclosure, a non-isothermal wet atomic layer etch (ALE) process is provided for etching polycrystalline materials, such as metals, metal oxides and silicon-based materials, formed on a substrate. More specifically, the present disclosure provides various embodiments of methods that utilize thermal cycling in a wet ALE process to independently optimize the reaction temperatures utilized within individual processing steps of the wet ALE process. Like conventional wet ALE processes, the wet ALE process described herein is a cyclic process that includes multiple cycles of surface modification and dissolution steps. Unlike conventional wet ALE processes, however, the wet ALE process described herein is a non-isothermal process that performs the surface modification and dissolution steps at different temperatures. This allows independent optimization of the surface modification and dissolution reactions.

The non-isothermal wet ALE process described herein may generally include multiple ALE cycles, where each ALE cycle includes a surface modification step, a first purge step, a dissolution step and a second purge step, and where one or more of these processing steps is performed at a different temperature. In some embodiments, thermal cycling can be introduced as part of the wet ALE process described herein by dispensing liquid solutions utilized within one or more of the processing steps at a different temperature. The high heat capacity of the liquid solutions, combined with their high convective heat transfer coefficients, allows the substrate surface to reach thermal equilibration quickly, thus allowing the temperature of the substrate to be changed within the timescale of a single ALE cycle.

In some embodiments, the non-isothermal wet ALE process described herein may dispense a surface modification solution onto a surface of a substrate at a first temperature, and may subsequently dispense a dissolution solution onto the surface of the substrate at a second temperature, which is different from the first temperature. The first temperature and the second temperature may be selected to independently optimize the reactions that occur during the surface modification and dissolution steps. In some embodiments, for example, the surface modification solution may be dispensed at a first temperature, which is less than or equal to room temperature (e.g., a temperature less than or equal to 25° C.). However, the dissolution solution may be dispensed at a second temperature, which is greater than room temperature (e.g., a temperature greater than or equal to 40° C.) to optimize the kinetics of the dissolution reaction. By utilizing liquid solutions having substantially different temperatures, the wet ALE process described herein provides a cyclic, non-isothermal etch process, which repeatedly adjusts the reaction temperatures of the surface modification and dissolution steps to independently optimize the surface modification and dissolution reactions.

During each ALE cycle, purge solutions may be dispensed onto the surface of the substrate between the surface modification and dissolution steps to remove the surface modification and dissolution solutions from the surface of the substrate. In some embodiments, the purge solutions may be utilized to pre-heat or pre-cool the substrate prior to performing the next processing step. After performing a surface modification step, for example, a heated purge solution may be dispensed onto the surface of the substrate to bring the temperature of the substrate closer to the second temperature (i.e., the desired dissolution reaction temperature) prior to performing the next dissolution step. After the dissolution step is performed, a room temperature (or cooled) purge solution may be dispensed onto the surface of the substrate to bring the temperature of the substrate closer to the first temperature (i.e., the desired surface modification reaction temperature) prior to performing the next surface modification step. By using the temperature and thermal mass of the purge solutions, the wet ALE process described herein is able to quickly adjust the surface of the substrate to the next process temperature.

The techniques described herein offer multiple advantages over conventional methods by providing a cyclic, non-isothermal wet ALE process for etching polycrystalline materials, such as metals. As noted above, thermal cycling is used in the wet ALE process described herein to independently optimize the reaction temperatures utilized within the surface modification and dissolution steps of the wet ALE process. In particular, thermal cycling is provided by utilizing heated (and/or cooled) liquid solutions, which quickly adjusts the reaction temperatures of the surface modification and dissolution steps within the timescale of a single ALE cycle to independently optimize the surface modification and dissolution reactions. Unlike some conventional etch processes, the cyclic, non-isothermal wet ALE process described herein is able to quickly change the substrate temperature during processing, and thus, is suitable for high volume manufacturing.

The techniques described herein may be used for etching a wide variety of polycrystalline materials, such as metals, metal oxides and silicon-based materials. Examples of metals that may be etched using the methods disclosed herein include, but are not limited to, ruthenium (Ru), cobalt (Co), copper (Cu), molybdenum (Mo), tungsten (W), gold (Au), platinum (Pt), iridium (Ir) and other transition metals. Example of metal oxides that may be etched using the methods disclosed herein include, but are not limited to, aluminum oxide ($Al_2O_3$), hafnium oxide ($HfO_2$). In some embodiments, the methods disclosed herein may also be used to etch silicon-based materials, such as but not limited to, silicon (Si), silicon oxides (e.g., SiO and $SiO_2$) and silicon nitrides (e.g., $Si_3N_4$). Although various examples are provided herein, one skilled in the art would recognize how the methods disclosed herein may be used to etch other metals, metal oxides and silicon-based materials. Example etch processes and etch chemistries for etching ruthenium and molybdenum are discussed in more detail below.

FIG. 1 illustrates one example of a cyclic, non-isothermal wet ALE process in accordance with the present disclosure. More specifically, FIG. 1 illustrates exemplary steps performed during one cycle of a non-isothermal wet ALE process used for etching a polycrystalline material 105, such as ruthenium (Ru). In the process shown in FIG. 1, a polycrystalline material 105 surrounded by a dielectric material 110 is brought in contact with a surface modification solution 115 during a surface modification step 100 to modify exposed surfaces of the polycrystalline material 105. In one embodiment, the polycrystalline material 105 to be etched may be ruthenium (Ru). When etching ruthenium, the surface modification solution 115 may contain a halogenation agent 120. For example, the surface modification solution 115 may include a first solvent containing a chlorination agent, a fluorinating agent or a brominating agent.

As shown in FIG. 1, a chemical reaction occurs at the exposed surface of the polycrystalline material 105 to form a passivation layer 125 (e.g., a ruthenium halide, a ruthenium oxyhalide or a ruthenium salt modified surface layer) in the surface modification step 100. In some cases, the chemical reaction to form the passivation layer 125 may be fast and self-limiting. In other words, the reaction product may modify one or more monolayers of the exposed surface of the polycrystalline material 105, but may prevent any further reaction between the surface modification solution 115 and the underlying surface. By necessity, neither the polycrystalline material 105 to be etched nor the passivation layer 125 can be soluble in the surface modification solution 115. In some cases, the surface modification step 100 shown in FIG. 1 may continue until the surface reaction is driven to saturation.

After the passivation layer 125 is formed, the substrate may be rinsed with a first purge solution 135 to remove excess reactants from the surface of the substrate in a first purge step 130. The purge solution 135 should not react with the passivation layer 125 or with the reagents present in the surface modification solution 115. In some embodiments, the first purge solution 135 used in the first purge step 130 may use the same solvent previously used in the surface modification step 100. In other embodiments, a different solvent may be used in the first purge solution 135. In some embodiments, the first purge step 130 may be long enough to completely remove all excess reactants from the substrate surface.

Once rinsed, a dissolution step 140 is performed to selectively remove the passivation layer 125 from the underlying surface of the polycrystalline material 105. In the dissolution step 140, the passivation layer 125 is exposed to a dissolution solution 145 to selectively remove or dissolve passivation layer 125 without removing the unmodified polycrystalline material 105 underlying the passivation layer 125. The passivation layer 125 must be soluble in the dissolution solution 145, while the unmodified polycrystalline material 105 underlying the passivation layer 125 must be insoluble. The solubility of the passivation layer 125 allows its removal through dissolution into the bulk dissolution solution 145. In some embodiments, the dissolution step 140 may continue until the passivation layer 125 is completely dissolved.

A variety of different dissolution solutions 145 may be used in the dissolution step, depending on the surface modification solution 115 used during the surface modification step 100 and/or the passivation layer 125 formed. In some embodiments, for example, the dissolution solution 145 may be an aqueous solution containing a ligand 150, which assists in the dissolution process. For example, dissolution solution 145 may contain a ligand 150 dissolved in an aqueous solution containing a second solvent. The ligand 150 contained within the dissolution solution 145 may react or bind with the passivation layer 125 to form a soluble species that dissolves within the second solvent to selectively remove the passivation layer 125 from the underlying surface of the polycrystalline material 105. In some embodiments, the second solvent included within the dissolution solution 145 may be different from the first solvent included within the surface modification solution 115.

Once the passivation layer 125 is dissolved, the ALE etch cycle shown in FIG. 1 may be completed by performing a second purge step 160. The second purge step 160 may be performed by rinsing the surface of the substrate with a second purge solution 165, which may be the same or different than the first purge solution 135. In some embodiments, second purge solution 165 may use the same solvent (i.e., the second solvent), which was used in the dissolution solution 145. The second purge step 160 may generally continue until the dissolution solution 145 and/or the reactants contained with the dissolution solution 145 are completely removed from the surface of the substrate.

Wet ALE of ruthenium requires the formation of a self-limiting passivation layer on the ruthenium surface. The formation of this passivation layer is accomplished by exposure of the ruthenium surface to a first etch solution (i.e., surface modification solution 115) that enables or causes a chemical reaction between the species in solution and the ruthenium surface. This passivation layer must be insoluble in the solution used for its formation, but freely soluble in the second etch solution (i.e., dissolution solution 145) used for its dissolution.

Although many chemicals can be used to etch ruthenium, the polycrystalline nature of ruthenium makes it susceptible to pitting if an etchant preferentially attacks the grain boundaries. Etchant chemistry should, at a minimum, leave the surface no rougher than it was initially and ideally improve the surface roughness during etching. Acceptable surface morphology can be accomplished through the formation of a self-limiting passivation layer that is selectively removed in a cyclic wet ALE process.

The present disclosure contemplates a wide variety of etch chemistries that may be used in the surface modification solution 115 and the dissolution solution 145 when etching ruthenium using the wet ALE process shown in FIG. 1. Example etch chemistries are discussed in more detail below. Mixing of these solutions leads to a continuous etch process, loss of control of the etch and roughening of the post-etch surface, all of which undermines the benefits of wet ALE. Thus, purge steps 130 and 160 are performed in the wet ALE process shown in FIG. 1 to prevent direct contact between the surface modification solution 115 and the dissolution solution 145 on the substrate surface.

According to one embodiment, the ruthenium surface may be exposed to a surface modification solution 115 including a first solvent containing a chlorination agent, which chemically modifies the ruthenium surface to form a ruthenium chloride passivation layer. In one example embodiment, a ruthenium trichloride ($RuCl_3$) may be used as the passivation layer. For example, a $RuCl_3$ passivation layer may be formed when the ruthenium surface is exposed to a solution of trichloroisocyanuric acid (TCCA) dissolved in ethyl acetate (EA). In this embodiment, the TCCA may act as both the oxidizer and the chlorine source in the reaction. Although TCCA oxidizes the ruthenium surface in the chemical sense to form a ruthenium trichloride ($RuCl_3$) passivation layer on the ruthenium surface, no metal-oxide is being formed in the reaction. This differs from conventional ruthenium etch chemistries, which utilize oxidizing agents (e.g., strong oxidizers) to form a ruthenium metal-oxide passivation layer.

The chlorine chemistry of ruthenium is very complicated. There are two distinct crystalline phases of $RuCl_3$. $\alpha$-$RuCl_3$ is almost completely insoluble, while $\beta$-$RuCl_3$ is hygroscopic and freely soluble in water, alcohol, and many organic solvents. Additionally, mixed oxychlorides can be formed when oxygen or water are present during chlorination. These oxychlorides tend to be highly soluble. Based on this chemistry, the $\alpha$-phase of $RuCl_3$ is considered herein as a preferred passivation layer, in some embodiments. Phase formation, however, is controlled by the reaction conditions.

The self-limiting passivation layer formed during the surface modification step 100 must be removed every cycle after its formation. A second solution is used in the dissolution step 140 to selectively dissolve this passivation layer. When TCCA dissolved in EA is used in the surface modification solution 115 to form $\alpha$-$RuCl_3$ on the ruthenium surface, a pure solvent does not work well in the dissolution step 140 because of the difficulty in dissolving $\alpha$-$RuCl_3$. Reactive dissolution, however, can be used to effectively remove the ruthenium chloride passivation layer. In reactive dissolution, ligands 150 dissolved in a second solvent react with the surface to form a soluble species that dissolve within the dissolution solution 145. Many different ligand species can be used for reactive dissolution of the $RuCl_3$ passivation layer. In one embodiment, ethylenediaminetetraacetic acid (EDTA) may be used as the ligand species for reactive dissolution. EDTA reacts with $RuCl_3$ to form a Ru-EDTA complex that is soluble in aqueous solution. This reaction is base catalyzed, so the dissolution solution 145 must contain EDTA and a strong base. Mixing of the TCCA-containing surface modification solution 115 and the EDTA-containing dissolution solution 145 leads to a continuous etch process, loss of control of the etch, and roughening of the surface. Therefore, solvent rinse steps (i.e., purges steps 130 and 160) are necessary to prevent direct contact between the two etch solutions on the ruthenium metal surface.

In the etch chemistry described above, the reactant used for the chlorination of the ruthenium surface is TCCA; however, many chlorination agents will work for this step. Alternative chlorination agents include, but are not strictly limited to, oxalyl chloride, thionyl chloride and N-chlorosuccinimide. This is not an exhaustive list of all possible chlorination agents that may be used in the surface modification step 100. Additionally, other ruthenium halides can also be used as a passivation layer. For example, ruthenium fluoride and ruthenium bromide can each be used, in addition to $RuCl_3$. These ruthenium halides can be formed using fluorinating agents or brominating agents, such as but not limited to, 1-Fluoro-2,4,6-trimethylpyridinium tetrafluoroborate, N-fluorobenzenesulfonimide, N-bromosuccinimide, or dibromoisocyanuric acid.

In the etch chemistry described above, the first solvent used within the surface modification solution 115 for the chlorination reaction is EA. However, other solvents such as acetone, acetonitrile, and chlorocarbons can also be used. Again, this is not an exhaustive list of solvents that can be used in the surface modification step 100.

In the etch chemistry described above, the dissolution solution 145 is an aqueous solution of EDTA as the ligand 150 and tetramethylammonium hydroxide (($CH_3$)$_4$NOH) as the base. Alternative ligands for dissolution include, but are not limited to, iminodiacetic acid (IDA), diethylenetriaminepentaacetic acid (DTPA), and acetylacetone (ACAC). EDTA, IDA, and DTPA can be used in aqueous solution, while ACAC can be used in aqueous solution, ethanol, dimethyl sulfoxide (DMSO) or other organic solvents. Any strong base can be used in the dissolution solution 145. For example, bases such as potassium hydroxide (KOH), sodium hydroxide (NaOH), ammonium hydroxide ($NH_4OH$), Tetramethylammonium hydroxide (($CH_3$)$_4$NOH), or any other strong base can be used in the dissolution solution 145 as it is just needed to deprotonate the ligand 150 to allow binding with the ruthenium surface.

The ruthenium wet ALE process shown in FIG. 1 and described above uses a solution of trichloroisocyanuric acid (TCCA) in ethyl acetate (EA) to form a self-limiting ruthenium chloride ($RuCl_3$) passivation layer. The ruthenium chloride passivation layer is then dissolved in an aqueous solution of ethylenediaminetetraacetic acid (EDTA) at high pH. The dissolution occurs through a ligand exchange process, where the EDTA replaces the chloride as a ligand around the ruthenium metal center. Although this dissolution process is slow at room temperature, the kinetics can be improved by dissolving the ruthenium chloride passivation layer at elevated temperature. In some embodiments, a larger etch amount per cycle can be achieved by running the dissolution at 100° C., as shown in FIG. 2.

Etching experiments were conducted on coupons cut from a 300 mm silicon wafer with various thicknesses of chemical vapor deposition (CVD) ruthenium deposited on one side. The etch recipe used to etch the ruthenium includes multiple wet ALE cycles, where each cycle includes a one minute dip in 5% TCCA dissolved in EA, followed by an EA rinse, a 30 second dip in an aqueous solution of 50 mM EDTA and 1 M KOH in $H_2O$ (or deionized water), a 1 M KOH rinse (or deionized water rinse) and an isopropyl alcohol (IPA) rinse and blow dry. The wet ALE process was repeated for a number of ALE cycles under different process conditions: a hot water dissolution, a room temperature (RT) reactive dissolution and a hot reactive dissolution. The hot dissolutions were performed at 100° C.

Figure 2:
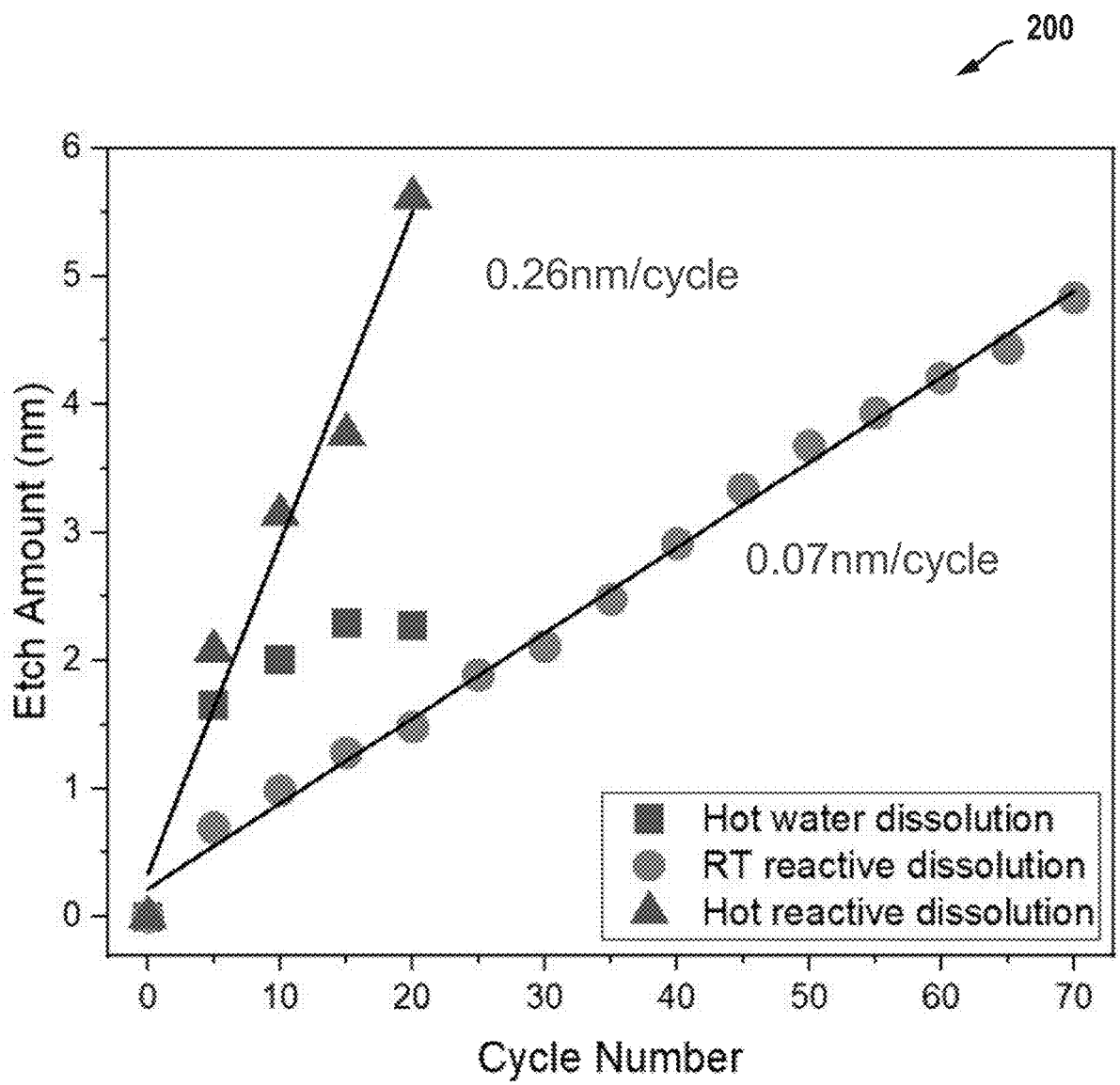
FIG. 2 is a graph depicting exemplary etch amounts (expressed in nanometers, nm) that may be achieved as a function of cycle number when attempting to etch ruthenium using various etch conditions.

The total etch amount (nm) as a function of cycle number for the various etch conditions described above is illustrated in the graph 200 shown in FIG. 2. Reactive dissolution at room temperature (RT) gives an etch rate of 0.07 nm/cycle. This is much less than a full monolayer of ruthenium and indicates that the dissolution kinetics may be slow at room temperature. The etch amount per cycle increases substantially (e.g., 0.26 nm/cycle) when the dissolution solution is heated, confirming that the dissolution reaction is kinetically limited. The etch rate decreased with cycle number and eventually stopped when the experiment was run using deionized water for dissolution, rather than a solution of EDTA and KOH. This behavior can be explained if the passivation layer contains a mixture of $\alpha$-$RuCl_3$, $\beta$-$RuCl_3$, and various ruthenium oxychlorides ($RuO_xCl_y$). The $\beta$-$RuCl_3$ and $RuO_xCl_y$ will be water-soluble while the $\alpha$-$RuCl_3$ will remain on the surface. The amount of $\alpha$-$RuCl_3$ on the surface will increase, cycle after cycle, until the entire surface is passivated with insoluble $\alpha$-$RuCl_3$ and the etch cannot continue. This behavior indicates that ligands 150 in the dissolution solution 145 are beneficial to successful etch behavior.

As shown in FIG. 2, the dissolution reaction can be optimized and the etch rate can be increased (e.g., from 0.07 nm/cycle to 0.26 nm/cycle) by heating the dissolution solution 145 to an elevated temperature above room temperature. Although the experimental results shown in FIG. 2 were obtained by heating the dissolution solution 145 to 100° C., the dissolution solution 145 may be heated to any temperature that optimizes the dissolution reaction and/or produces a desirable etch rate without exceeding the boiling point of the dissolution solution 145. When utilizing aqueous solutions, the temperature of the dissolution solution 145 is limited to 100° C. (the boiling point of water). However, when non-aqueous solutions are used, the maximum temperature of the dissolution solution 145 may be significantly higher. For example, when ruthenium is etched using ligands dissolved in DMSO, the maximum temperature of the dissolution solution 145 may be limited to 190° C. (the boiling point of DMSO). Other temperatures may be used for the dissolution solution 145 depending on the polycrystalline material being etched and the etch chemistry utilized within the dissolution solution 145. Regardless of the particular etch chemistry used, the etch amount per cycle is expected to increase monotonically with increasing temperature until the entire passivation layer 125 is removed or the solvent boiling point is reached—whichever happens at a lower temperature.

Although increasing the temperature of the dissolution solution 145 is beneficial to the dissolution reaction, increased temperatures may be undesirable in the surface modification step. In some cases, the etch chemistries used within the surface modification solution 115 may require the surface modification step 100 to be performed at a substantially lower temperature. For example, ethyl acetate (EA) boils at 77° C. When EA is used within the surface modification solution 115, the surface modification solution 115 must be supplied to the substrate at a temperature lower than the boiling point of EA, otherwise solvent evaporation may precipitate solute onto the surface. In some embodiments, the surface modification solution 115 shown in FIG. 1 may be provided to the substrate at (or near) room temperature (e.g., a temperature ranging between 20° C. and 25° C.). Other temperatures may be used for the surface modification solution 115 depending on the polycrystalline material being etched and the etch chemistry. In some embodiments, the surface modification solution 115 may be supplied to the substrate at a temperature, which is less than or equal to room temperature. For example, the surface modification solution 115 be supplied to the substrate within a temperature range having a lower limit that is set by a freezing point of the surface modification solution 115 and an upper limit of 25° C.

The data shown in FIG. 2 was collected using a wet ALE cycle where the chlorination step was performed at room temperature and the dissolution step was performed at 100° C. In this case, the desired reaction temperature for the dissolution of the $RuCl_3$ passivation layer is above the boiling point of ethyl acetate. Because of this, the wet ALE cycle must be run non-isothermally, or the etch rate must be reduced by reducing the temperature of the dissolution step. In some cases, it may be beneficial to run the chlorination step at room temperature. For example, volatilization of ethyl acetate at elevated temperatures can lead to the precipitation of TCCA on the substrate surface during processing, and any solid TCCA left behind on the surface can lead to uncontrolled etching if it mixes with the aqueous ligand exchange solution. For these reasons, ruthenium wet ALE benefits from being run as a non-isothermal process.

In preferred embodiments of the present disclosure, the wet ALE process shown in FIG. 1 is performed as a non-isothermal process. As noted above and shown in FIG. 1, the wet ALE process described herein may generally include multiple ALE cycles, where each ALE cycle includes a surface modification step 100, a first purge step 130, a dissolution step 140 and a second purge step 160. In the present disclosure, one or more of these processing steps 100, 130, 140 and 160 may be performed at a different temperature.

In the present disclosure, thermal cycling is introduced as part of the wet ALE process shown in FIG. 1 by dispensing the liquid solutions utilized within one or more of the processing steps 100, 130, 140 and 160 at a different temperature. The high heat capacity of the liquid solutions, combined with their high convective heat transfer coefficients, allows the substrate surface to reach thermal equilibration quickly, thus allowing the temperature of the substrate to be changed within the timescale of a single ALE cycle.

Figure 3:
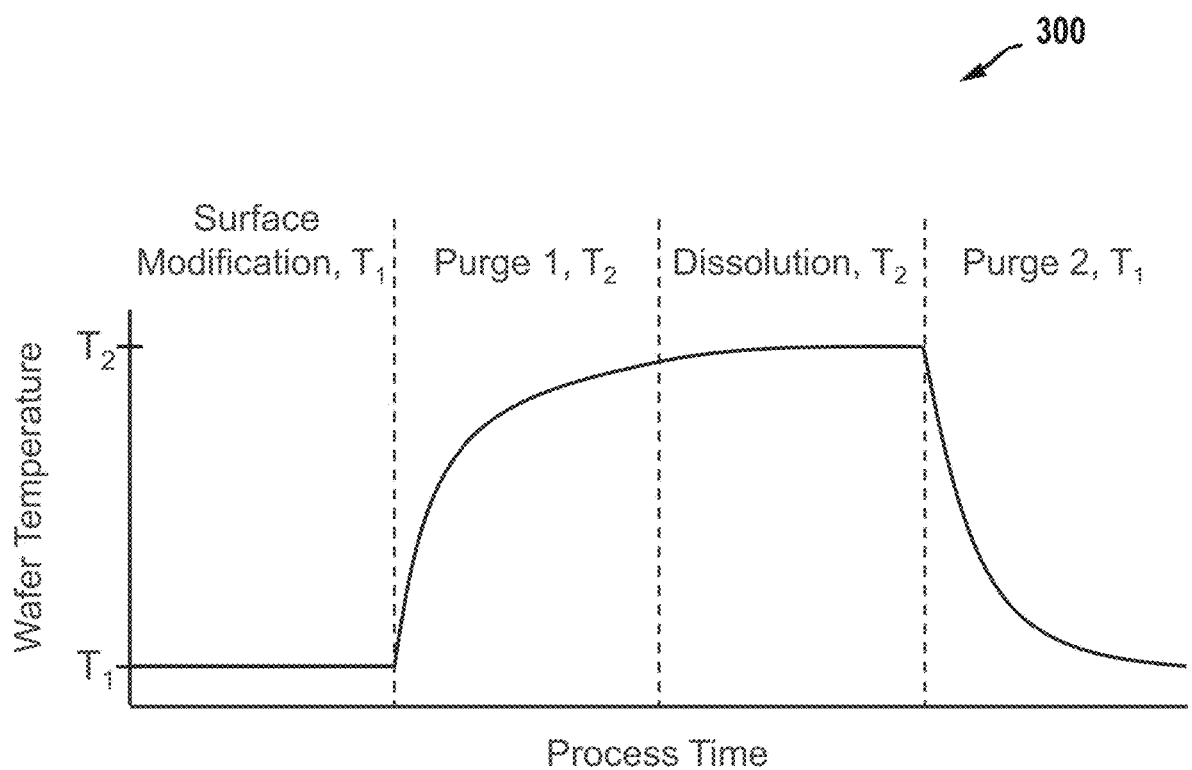
FIG. 3 is a graph illustrating how the temperature of the individual process steps of the non-isothermal wet ALE process may be adjusted during each ALE cycle.

In some embodiments, the wet ALE process shown in FIG. 1 may dispense the surface modification solution 115 onto a surface of a substrate at a first temperature ($T_1$), and may dispense the dissolution solution 145 onto the surface of the substrate at a second temperature ($T_2$), which is different from the first temperature, as depicted in the graph 300 shown in FIG. 3. The first and second temperatures may be selected to independently optimize the reactions that occur during the surface modification step 100 and the dissolution step 140. In some embodiments, for example, the surface modification solution may be dispensed at approximately room temperature (e.g., a temperature ranging between 20° C. and 25° C.). However, the dissolution solution may be dispensed at an elevated temperature (e.g., a temperature ranging between 40° C. and 190° C.) to optimize the kinetics of the dissolution reaction. By utilizing liquid solutions having substantially different temperatures, the wet ALE process shown in FIG. 1 provides a cyclic, non-isothermal etch process, which repeatedly adjusts the reaction temperatures of the surface modification and dissolution steps to independently optimize the surface modification and dissolution reactions.

As shown in FIG. 1, purge solutions 135 and 165 may be dispensed onto the surface of the substrate between the surface modification step 100 and the dissolution step 140 to remove the surface modification and dissolution solutions from the surface of the substrate. In some embodiments, the purge solutions 135 and 165 may be utilized to pre-heat or pre-cool the substrate prior to performing the next processing step. After performing the surface modification step 100, for example, a heated purge solution 135 may be dispensed onto the surface of the substrate. The heated purge solution may be used to adjust or bring the temperature of the substrate closer to the second temperature ($T_2$, i.e., the desired dissolution reaction temperature) prior to performing the next dissolution step, as shown in FIG. 3. After the dissolution step 140 is performed, a room temperature (or cooled) purge solution 165 may be dispensed onto the surface of the substrate. The room temperature (or cooled) purge solution 165 may be used to adjust or bring the temperature of the substrate closer to the first temperature ($T_1$, i.e., the desired surface modification reaction temperature) prior to performing the next surface modification step. By using the temperature and thermal mass of the purge solutions 135 and 165, the wet ALE process described herein is able to quickly adjust the surface of the substrate to the next process temperature.

According to one embodiment, the cyclic, non-isothermal wet ALE process shown in FIG. 1 for etching a ruthenium surface may include: a) a surface modification step 100 in which the ruthenium surface is exposed to a surface modification solution 115 containing a halogenating agent to chemically modify the ruthenium surface and form a ruthenium halide passivation layer 125, wherein the surface modification solution 115 is dispensed onto a surface of the substrate at a first temperature; b) a first purge step 130 in which the substrate is rinsed with a first purge solution 135 to remove the surface modification solution 115 from the surface of the substrate; c) a dissolution step 140 in which the ruthenium halide passivation layer is exposed to a dissolution solution 145 to selectively remove the ruthenium halide passivation layer 125 without removing the ruthenium surface underlying the ruthenium halide passivation layer 125, wherein the second etch solution is dispensed onto the surface of the substrate at a second temperature, which is different from the first temperature; and d) a second purge step 160 in which the substrate is rinsed with a second purge solution 165 to remove the dissolution solution 145 from the surface of the substrate. In some embodiments, the steps a)-d) may be repeated for one or more ALE cycles, until a desired amount of the ruthenium material has been removed. It is recognized that the cyclic, non-isothermal wet ALE process shown in FIG. 1 is merely one example of a non-isothermal etch process that may be used to etch a polycrystalline material 105, such as ruthenium.

The ruthenium wet ALE process described above and shown in FIG. 1 relies on both the surface modification and dissolution reactions being self-limiting. Self-limiting means that only a limited thickness of the ruthenium at the surface is modified or removed, regardless of how long a given etch solution is in contact with the ruthenium surface. The self-limiting reaction can be limited to one or more monolayers of reaction, or a partial monolayer of reaction.

Figure 4:
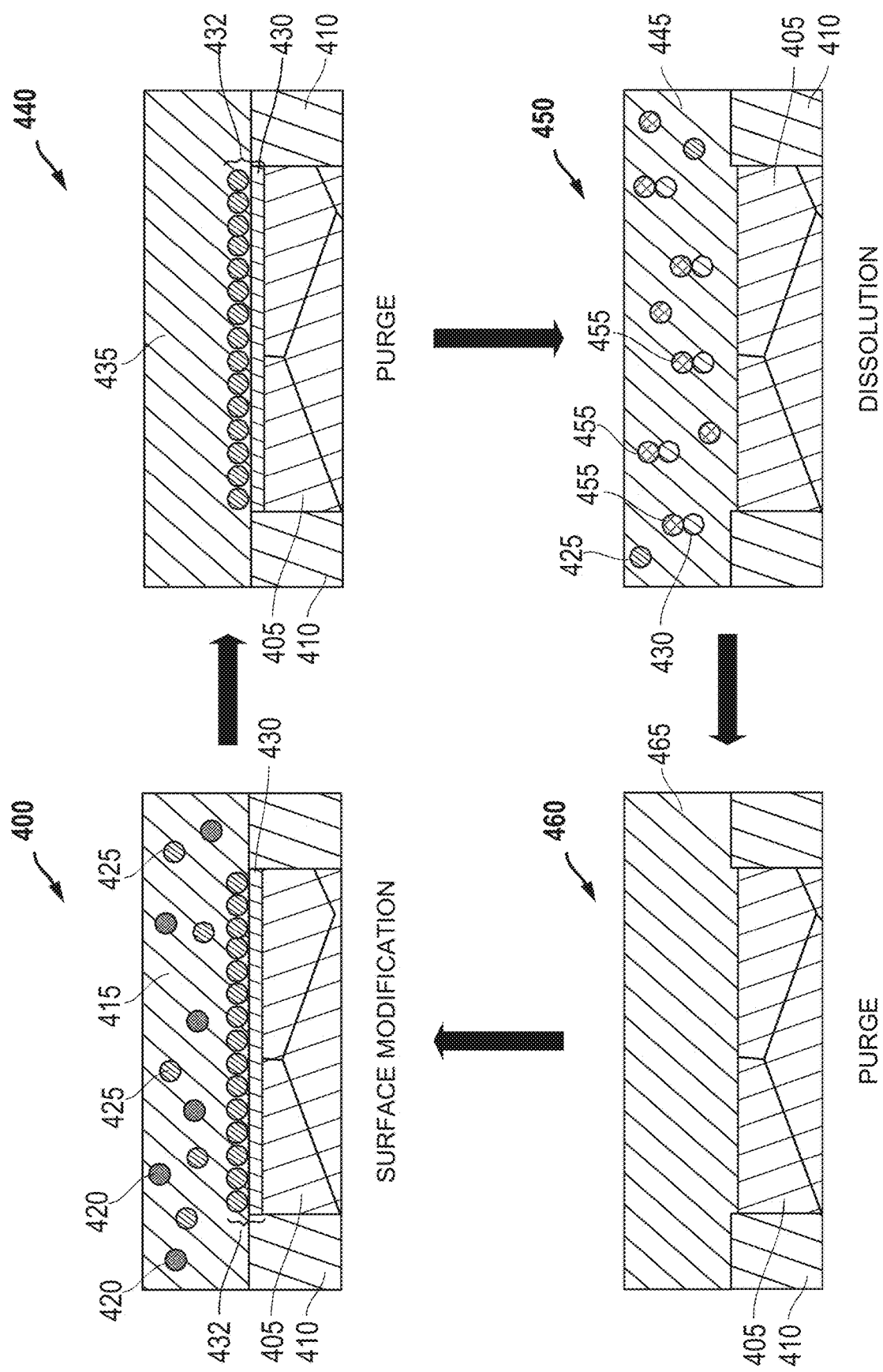
FIG. 4 illustrates one example of a cyclic, non-isothermal wet atomic layer etching (ALE) process that can be used to etch molybdenum in accordance with the present disclosure.

The ruthenium wet ALE process described above and shown in FIG. 1 can be accomplished using a variety of techniques. For example, the ruthenium wet ALE process disclosed above may be performed by dipping the ruthenium sample in beakers of each etch solution. In this case, purging can be accomplished by either rinsing or dipping the sample in an appropriate solvent bath. The ruthenium wet ALE process can also be accomplished on a spinner. For example, the ruthenium sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. In some embodiments, solution can also be dispensed onto the backside of the wafer to help control temperature. Deionized (DI) water can be used for this purpose. For example, hot DI water can be dispensed onto the backside of the wafer during the dissolution step and room temperature DI water can be dispensed onto the backside of the wafer during the surface modification step. For high volume manufacturing, dispensing of etch solu- FIG. 4 illustrates another example of a cyclic, non-isothermal wet ALE process in accordance with the present disclosure. More specifically, FIG. 4 illustrates exemplary steps performed during one cycle of a non-isothermal wet ALE process used for etching a polycrystalline material 405, such as molybdenum (Mo). In the process shown in FIG. 4, a polycrystalline material 405 surrounded by a dielectric material 410 is brought in contact with a surface modification solution 415 during a surface modification step 400 to modify exposed surfaces of the polycrystalline material 405. In one embodiment, the polycrystalline material 405 to be etched is molybdenum (Mo). When etching molybdenum, the surface modification solution 415 can contain an oxidation agent 420 and a first ligand 425 dissolved in a first solvent.

As shown in FIG. 4, the oxidation agent 420 oxidizes an exposed surface of the polycrystalline material 405 to form a passivation layer 430 (e.g., a molybdenum oxide passivation layer) in the surface modification step 400. In some cases, the chemical reaction to form the passivation layer 430 may be fast and self-limiting. In other words, the reaction product may modify one or more monolayers of the exposed surface of the polycrystalline material 405, but may prevent any further reaction between the surface modification solution 415 and the underlying surface. The first ligand 425 included within the surface modification solution 415 reacts with and binds to the passivation layer 430 to form a ligand-metal complex 432, which is insoluble in the first solvent. In some cases, the surface modification step 400 shown in FIG. 4 may continue until the surface reaction is driven to saturation.

After the ligand-metal complex 432 is formed, the substrate may be rinsed with a first purge solution 435 to remove excess reactants from the surface of the substrate in a first purge step 440. The purge solution 435 should not react with the ligand-metal complex 432 or with the reagents present in the surface modification solution 415. In some embodiments, the first purge solution 435 used in the first purge step 440 may use the same solvent previously used in the surface modification step 400. In other embodiments, a different solvent may be used in the first purge solution 435. In some embodiments, the first purge step 440 may be long enough to completely remove all excess reactants from the substrate surface.

Once rinsed, a dissolution solution 445 is supplied to the substrate to selectively remove the passivation layer 430 from the underlying surface of the polycrystalline material 405 in a dissolution step 450. In one embodiment, the dissolution solution 445 may include a second ligand 455 dissolved in a second solvent. When exposed to the dissolution solution 445, a ligand exchange process exchanges the first ligand 425 in the ligand-metal complex 432 with the second ligand 455 included within the dissolution solution 445 to form a soluble species, which is dissolved within the second solvent to selectively remove the passivation layer 430 without removing the unmodified polycrystalline material 405 underlying the passivation layer 430. After ligand exchange, the passivation layer 430 becomes soluble in the dissolution solution 445, which allows for its removal through dissolution into the bulk dissolution solution 445. However, the unmodified polycrystalline material 405 underlying the passivation layer 430 must be insoluble in the dissolution solution 445. In some embodiments, the dissolution step 450 may continue until the passivation layer 430 is completely dissolved.

Once the passivation layer 430 is dissolved, the ALE etch cycle shown in FIG. 4 may be completed by performing a second purge step 460. The second purge step 460 may be performed by rinsing the surface of the substrate with a second purge solution 465, which may be the same or different than the first purge solution 435. In some embodiments, the second purge solution 465 may use the same solvent (i.e., the first solvent), which was used in the surface modification solution 415. The second purge step 460 may generally continue until the dissolution solution 445 and/or the reactants contained with the dissolution solution 445 are completely removed from the surface of the substrate.

The present disclosure contemplates a wide variety of etch chemistries that may be used in the surface modification solution 415 and the dissolution solution 445 when etching molybdenum using the wet ALE process shown in FIG. 4. Example etch chemistries are discussed in more detail below. Mixing of these solutions leads to a continuous etch process, loss of control of the etch and roughening of the post-etch surface, all of which undermines the benefits of wet ALE. Thus, purge steps 440 and 460 are performed in the wet ALE process shown in FIG. 4 to prevent direct contact between the surface modification solution 415 and the dissolution solution 445 on the substrate surface.

In some embodiments, the surface modification solution 415 used for etching the molybdenum surface may include an oxidation agent 420 (such as, e.g., hydrogen peroxide ($H_2O_2$), ammonium persulfate (($NH_4)_2S_2O_8$), potassium persulfate ($K_2S_2O_8$), permanganate salts, cerium (IV) salts and dissolved gases, such as nitrogen dioxide ($NO_2$) and ozone ($O_3$)) and a first ligand 425 (e.g., a carboxylate-based ligand, such as oxalic acid, mandelic acid, malic acid, maleic acid or fumaric acid) dissolved in an organic solvent (such as isopropyl alcohol (IPA) or another alcohol, diethyl ether (($C_2H_5)_2O$), acetonitrile ($C_2H_3N$), dimethyl sulfoxide ($C_2H_6OS$), a ketone or an acetate). In one example embodiment, the molybdenum surface may be exposed to a surface modification solution 415 containing $H_2O_2$ and oxalic acid dissolved in IPA. In such an embodiment, the hydrogen peroxide ($H_2O_2$) oxidizes the molybdenum surface to form a molybdenum oxide ($MoO_3$) passivation layer, which then complexes with the oxalic acid within the surface modification solution 415 to form a ligand-metal complex 432 (e.g., an oxymolybdenum oxalate complex), which is insoluble in the organic solvent.

In some embodiments, the dissolution solution 445 used for etching the molybdenum surface may include a second ligand 455 (e.g., ascorbic acid) dissolved in aqueous solution at low pH (such as, e.g., aqueous hydrochloric acid (HCl), sulfuric acid ($H_2SO_4$) or another strong acid). Oxymolybdenum oxalate is not soluble in aqueous HCl, but the ascorbate is. When exposed to a dissolution solution 445 containing ascorbic acid dissolved in aqueous HCl, a ligand-exchange mechanism exchanges the oxalic acid in the oxymolybdenum oxalate complex with the ascorbic acid included within the dissolution solution to form an oxymolybdenum ascorbate, which is dissolved within the aqueous HCl to selectively remove the molybdenum oxide passivation layer from the molybdenum surface.

Figure 6:
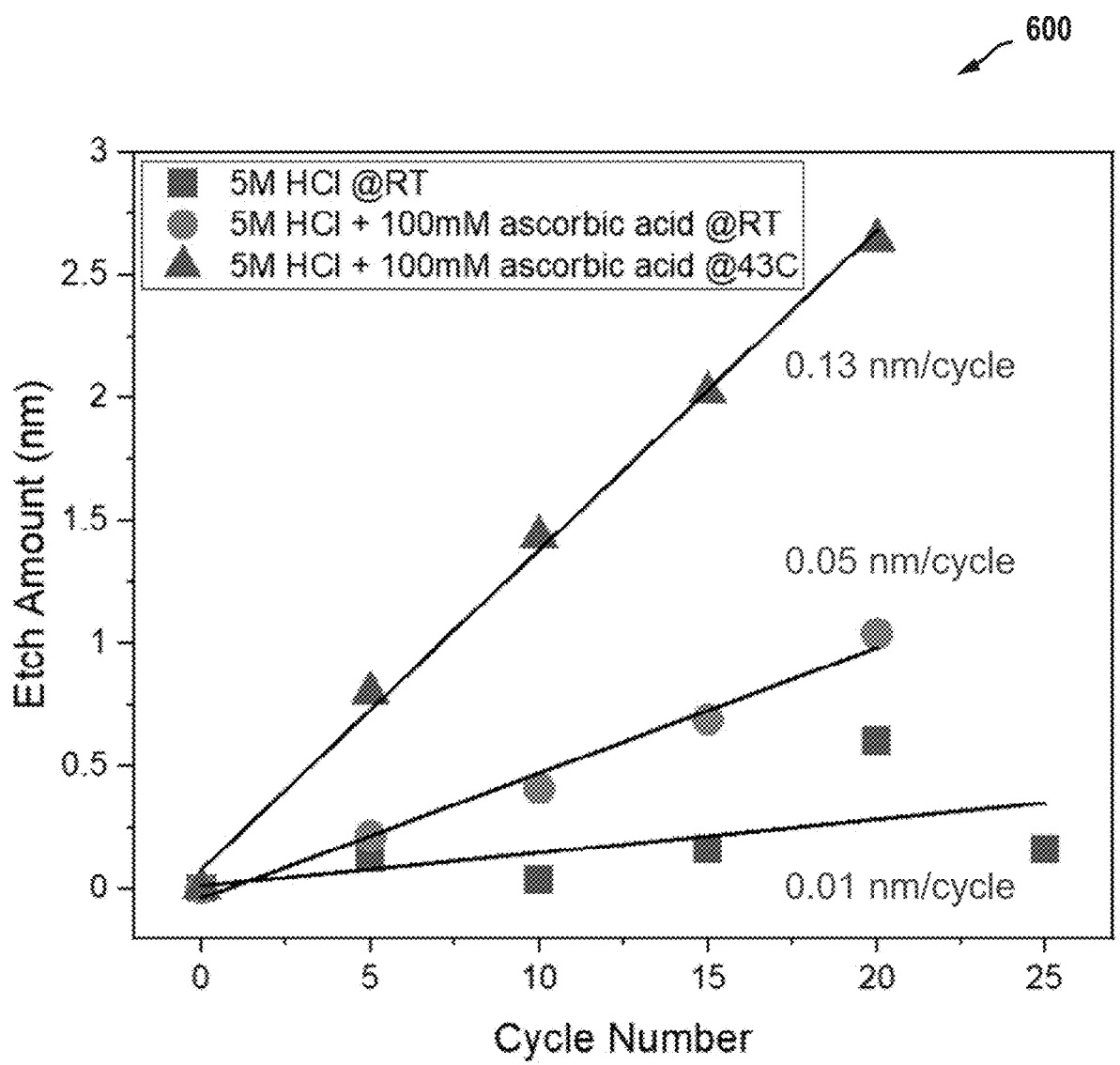
FIG. 6 is a graph depicting exemplary etch amounts (expressed in nanometers, nm) that may be achieved as a function of cycle number when attempting to etch molybdenum using various etch conditions.

According to one embodiment, the molybdenum wet ALE process shown in FIG. 4 and described above uses a solution of hydrogen peroxide ($H_2O_2$) and oxalic acid in IPA to form a self-limiting oxymolybdenum oxalate passivation layer. The oxymolybdenum oxalate passivation layer is then dissolved in an aqueous solution of a concentrated acid (e.g., HCl, $H_2SO_4$, other strong acid) containing ascorbic acid. The dissolution occurs through a ligand exchange process, where the ascorbic acid replaces the oxalic acid to form an oxymolybdenum ascorbate passivation layer. Although this dissolution process is slow at room temperature, the kinetics can be improved by dissolving the oxymolybdenum ascorbate passivation layer at elevated temperature. In some embodiments, a larger etch amount per cycle can be achieved by running the dissolution at 43° C., as shown in FIG. 6.

Etching experiments were conducted on coupons cut from a 300 mm silicon wafer with various thicknesses of chemical vapor deposition (CVD) molybdenum deposited on one side. The etch recipe used to etch the molybdenum includes multiple wet ALE cycles, where each cycle includes a 10 second dip in 0.1% hydrogen peroxide ($H_2O_2$)+50 mM oxalic acid dissolved in isopropyl alcohol (IPA), followed by an IPA rinse, a 10 second dip in an aqueous solution of 50 M HCl+100 mM ascorbic acid and an IPA rinse. The wet ALE process was repeated for a number of ALE cycles under different process conditions, as shown in FIGS. 5 and 6.

Figure 5:
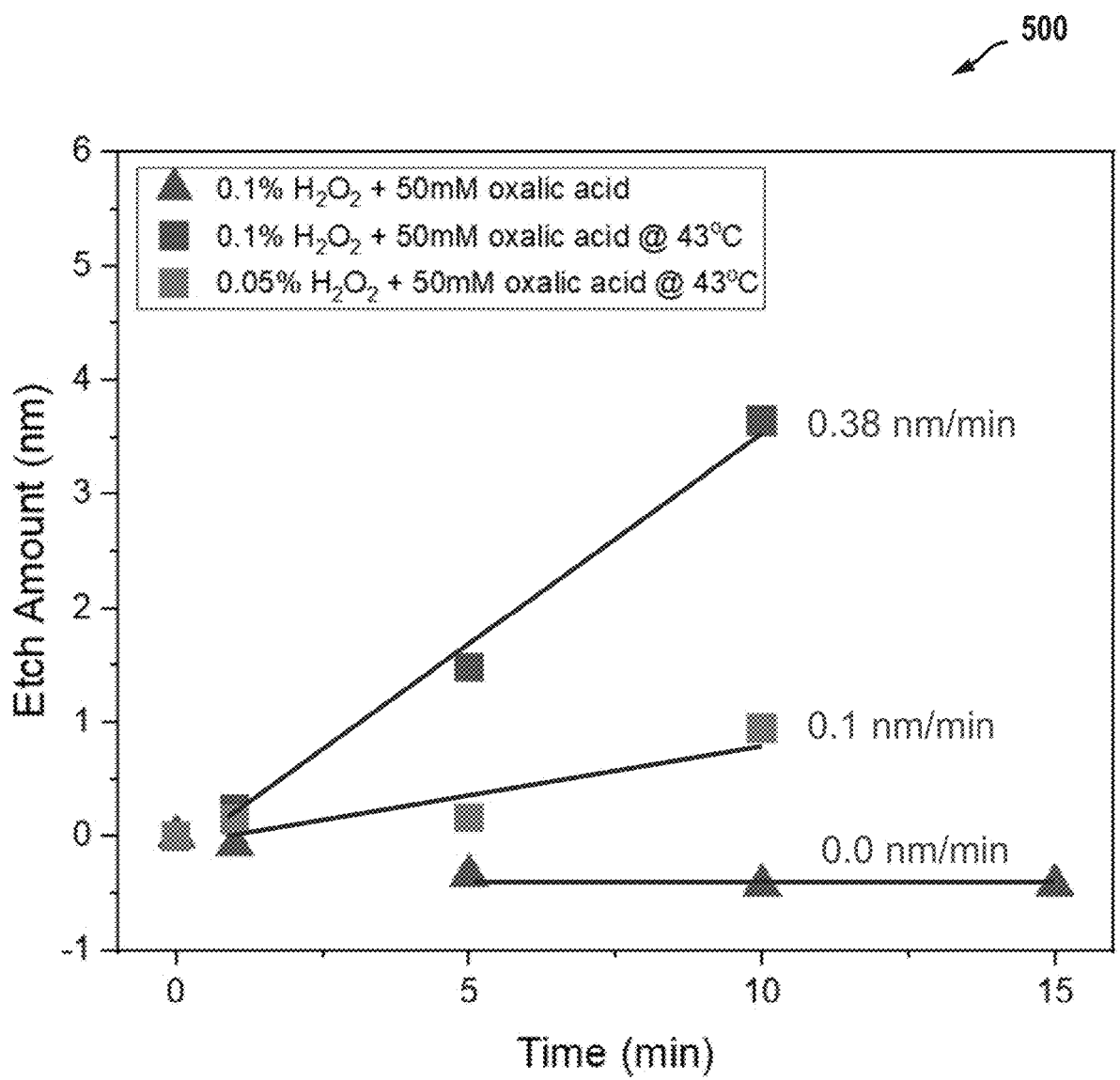
FIG. 5 is a graph illustrating how the oxidation of the molybdenum surface using hydrogen peroxide ($H_2O_2$) and oxalic acid in isopropyl alcohol (IPA) to form oxymolybdenum oxalate is self-limiting at room temperature, but not self-limiting at elevated temperatures.

The graph 500 shown in FIG. 5 illustrates the total etch amount (nm) as a function of time (minutes) for various surface modification conditions. To obtain the results shown in FIG. 5, the molybdenum coupon was soaked in: (a) a surface modification solution containing 0.1% $H_2O_2$+50 mM oxalic acid in IPA at room temperature, (b) a surface modification solution containing 0.1% $H_2O_2$+50 mM oxalic acid in IPA at 43° C. and (c) a surface modification solution containing 0.05% $H_2O_2$+50 mM oxalic acid in IPA at 43° C. As shown in FIG. 5, the oxymolybdenum oxalate formation process is self-limiting at room temperature, but is not self-limiting at elevated temperatures (e.g., continuous etch process re-appears at 43° C.). This limits the maximum temperature for the surface modification step 400. In some embodiments, the surface modification step 400 may be performed at room temperature (or lower) to avoid a continuous etch process.

The thermal activation of hydrogen peroxide-radical initiated polymerization relies on the cleaving of peroxide bonds with UV or thermal energy. The graph 500 shown in FIG. 5 further shows that the activity of hydrogen peroxide may be suppressed with lower peroxide concentration (e.g., 0.05% $H_2O_2$). Thus, in some embodiments, it may be possible to perform the surface modification step 400 at an elevated temperature greater than room temperature.

The graph 600 shown in FIG. 6 illustrates the total etch amount (nm) as a function of cycle number for various dissolution conditions. To obtain the results shown in FIG. 6, the molybdenum coupon was soaked in: (a) 5 M HCL at room temperature, (b) 5 M HCL+100 mM ascorbic acid at room temperature and (c) 5 M HCL+100 mM ascorbic acid at 43° C. The graph 600 shown in FIG. 6 shows that oxymolybdenum oxalate is not soluble in HCL, however, the ascorbate is. When the molybdenum coupon is exposed to a dissolution solution containing 5 M HCL+100 mM ascorbic acid, a ligand-exchange mechanism exchanges the oxalic acid in the oxymolybdenum oxalate complex with the ascorbic acid included within the dissolution solution to form an oxymolybdenum ascorbate, which is dissolved within the aqueous HCl. Thus, the dissolution of the oxymolybdenum oxalate can be accomplished through ligand exchange where oxymolybdenum ascorbate is the soluble species.

Reactive dissolution in 5 M HCl+100 mM ascorbic acid at room temperature (RT) gives an etch rate of 0.05 nm/cycle. This is much less than a full monolayer of molybdenum and indicates that the dissolution kinetics may be slow at room temperature. The etch amount per cycle increases (e.g., 0.13 nm/cycle) when the dissolution solution is heated (e.g., to 43° C.), confirming that the dissolution reaction is kinetically limited. The etch rate decreased with cycle number and eventually stopped when the experiment was run using only HCl for dissolution, rather than a solution of HCl and ascorbic acid.

As shown in FIG. 6, the dissolution reaction can be optimized and the etch rate can be increased (e.g., from 0.05 nm/cycle to 0.13 nm/cycle) by heating the dissolution solution 445 to an elevated temperature above room temperature. Although the experimental results shown in FIG. 6 were obtained by heating the dissolution solution 445 to 43° C., the dissolution solution 445 may be heated to any temperature that optimizes the dissolution reaction and/or produces a desirable etch rate without exceeding the boiling point of the dissolution solution 445. In some embodiments, the dissolution solution 445 shown in FIG. 4 may be heated to a temperature ranging between approximately 40° C. and 107° C. when using a dissolution solution 445 containing 5 M HCL+100 mM ascorbic acid to etch molybdenum. However, the dissolution solution 445 may be heated to different temperature ranges when other acidic solutions are used to etch molybdenum. For example, the dissolution solution 445 may be heated to a temperature ranging between 40° C.-337° C. when using pure sulfuric acid ($H_2SO_4$) or 40° C.-100° C. when using a 1M sulfuric acid solution to etch molybdenum. Other temperatures may be used for the dissolution solution 445 depending on the polycrystalline material being etched and the etch chemistry utilized within the dissolution solution 445. Regardless of the particular etch chemistry used, the etch amount per cycle is expected to increase monotonically with increasing temperature until the entire passivation layer 430 is removed or the solvent boiling point is reached—whichever happens at a lower temperature.

Like the ruthenium wet ALE process shown in FIG. 1, the molybdenum wet ALE process described above and shown in FIG. 4 relies on both the surface modification and dissolution reactions being self-limiting. Self-limiting means that only a limited thickness of the molybdenum at the surface is modified or removed, regardless of how long a given etch solution is in contact with the molybdenum surface. The self-limiting reaction can be limited to one or more monolayers of reaction, or a partial monolayer of reaction.

In some embodiments, the molybdenum wet ALE process described above and shown in FIG. 4 may require oxidation at low temperature and dissolution at high temperature. This requires a compromise in the optimization of the individual reaction steps, or running as a non-isothermal process to allow for the independent optimization of the surface modification and dissolution reactions.

The molybdenum wet ALE process described above and shown in FIG. 4 can be accomplished using a variety of techniques. For example, the molybdenum wet ALE process disclosed above may be performed by dipping the molybdenum sample in beakers of each etch solution. In this case, purging can be accomplished by either rinsing or dipping the sample in an appropriate solvent bath. The molybdenum wet ALE process can also be accomplished on a spinner. For example, the molybdenum sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. In some embodiments, solution can also be dispensed onto the backside of the wafer to help control temperature. Deionized (DI) water can be used for this purpose. For example, hot DI water can be dispensed onto the backside of the wafer during the dissolution step and room temperature DI water can be dispensed onto the backside of the wafer during the surface modification step. For high volume manufacturing, dispensing of etch solutions and rinses can be executed using conventional tools, such as wet etching tools and rinse tools.

Figure 7:
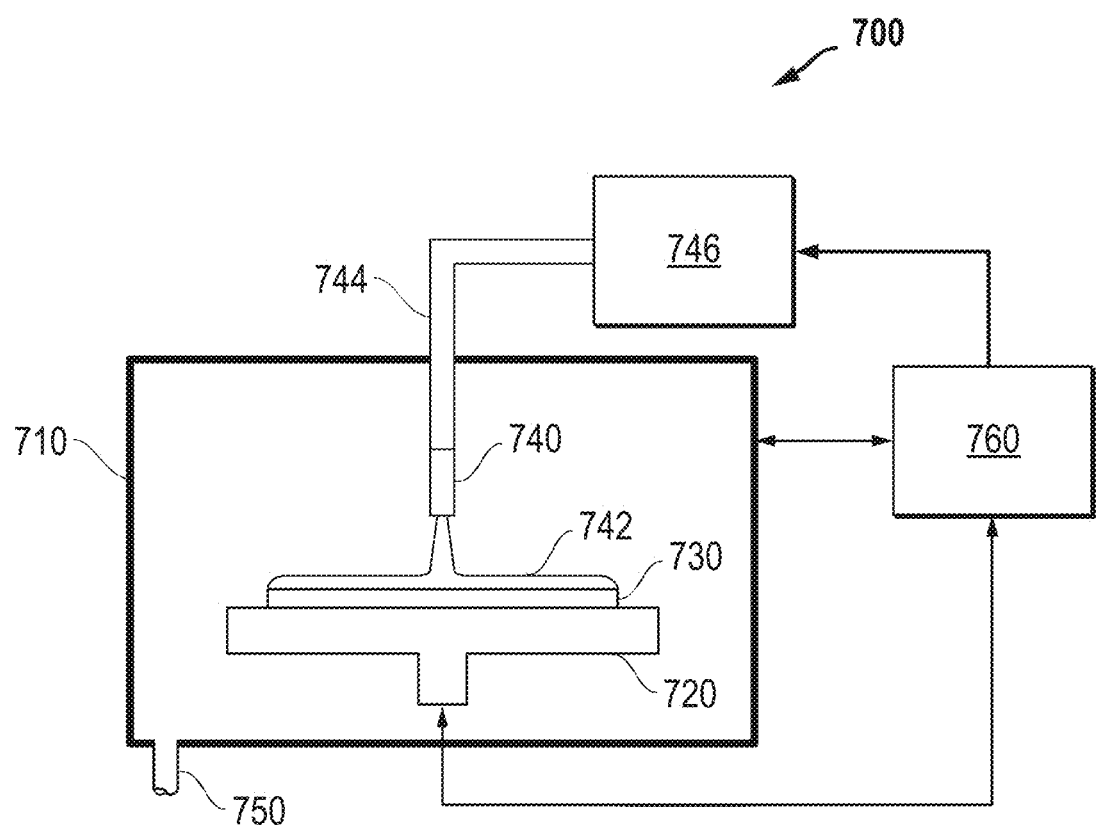
FIG. 7 is a block diagram of an example processing system that can use the techniques described herein to etch a polycrystalline material, such as ruthenium.

FIG. 7 illustrates one embodiment of a processing system 700 that may use the techniques described herein to etch a polycrystalline material, such as ruthenium, molybdenum, etc., on a surface of a substrate 730. As shown in FIG. 7, the processing system 700 includes a process chamber 710, which in some embodiments, may be a pressure controlled chamber. In the embodiment shown in FIG. 7, the process chamber 710 is a spin chamber having a spinner 720 (or spin chuck), which is configured to spin or rotate at a rotational speed. A substrate 730 is held on the spinner 720, for example, via electrostatic force or vacuum pressure. In one example, the substrate 730 may be a semiconductor wafer having a polycrystalline material, such as ruthenium or molybdenum, formed on or within the substrate 730.

The processing system 700 shown in FIG. 7 further includes a liquid nozzle 740, which is positioned over the substrate 730 for dispensing various etch solutions 742 onto a surface of the substrate 730. The etch solutions 742 dispensed onto the surface of the substrate 730 may generally include a surface modification solution to chemically modify an exposed surface of the polycrystalline material and form a passivation layer (e.g., a ruthenium halide passivation layer or an oxymolybdenum oxalate passivation layer), and a dissolution solution to selectively remove the passivation layer from the surface of the polycrystalline material. Purge solutions may also be dispensed onto the surface of the substrate 730 between surface modification and dissolution steps to separate the surface modification and dissolution solutions. Examples of surface modification, dissolution and purge solutions are discussed above.

As shown in FIG. 7, the etch solutions 742 may be stored within a chemical supply system 746, which may include one or more reservoirs for holding the various etch solutions 742 and a chemical injection manifold, which is fluidly coupled to the process chamber 710 via a liquid supply line 744. In operation, the chemical supply system 746 may selectively apply desired chemicals to the process chamber 710 via the liquid supply line 744 and the liquid nozzle 740 positioned within the process chamber 710. Thus, the chemical supply system 746 can be used to dispense the etch solutions 742 onto the surface of the substrate 730. The chemical supply system 746, liquid supply line 744 and/or liquid nozzle 740 may be configured to provide heated (and/or cooled) etch solutions 742 to the substrate. The process chamber 710 may further include a drain 750 for removing the etch solutions 742 from the process chamber 710.

Components of the processing system 700 can be coupled to, and controlled by, a controller 760, which in turn, can be coupled to a corresponding memory storage unit and user interface (not shown). Various processing operations can be executed via the user interface, and various processing recipes and operations can be stored in the memory storage unit. Accordingly, a given substrate 730 can be processed within the process chamber 710 in accordance with a particular recipe. In some embodiments, a given substrate 730 can be processed within the process chamber 710 in accordance with an etch recipe that utilizes the non-isothermal wet ALE techniques described herein.

The controller 760 shown in block diagram form in FIG. 7 can be implemented in a wide variety of manners. In one example, the controller 760 may be a computer. In another example, the controller 760 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 7, the controller 760 may be coupled to various components of the processing system 700 to receive inputs from, and provide outputs to, the components. For example, the controller 760 may be coupled to: the process chamber 710 for controlling the temperature and/or pressure within the process chamber 710; the spinner 720 for controlling the rotational speed of the spinner 720; and the chemical supply system 746 for controlling the various etch solutions 742 dispensed onto the substrate 730 and/or the temperature of the etch solutions 742. The controller 760 may control other processing system components not shown in FIG. 7, as is known in the art.

In some embodiments, the controller 760 may control the various components of the processing system 700 in accordance with an etch recipe that utilizes the non-isothermal wet ALE techniques described herein. For example, the controller 760 may supply various control signals to the chemical supply system 746, which cause the chemical supply system 746 to: a) dispense a surface modification solution onto the surface of the substrate 730 to chemically modify exposed surfaces of the polycrystalline material and create a passivation layer (e.g., a ruthenium halide passivation layer or an oxymolybdenum oxalate passivation layer) on the substrate 730; b) rinse the substrate 730 with a first purge solution to remove excess reactants from the surface; c) dispense a dissolution solution onto the surface of the substrate 730 to selectively remove or dissolve the passivation layer; and d) rinse the substrate with a second purge solution to remove the dissolution solution from the surface of the substrate 730. In some embodiments, the controller 760 may supply the control signals to the chemical supply system 746 in a cyclic manner, such that the steps a)-d) are repeated for one or more ALE cycles, until a desired amount of the polycrystalline material has been removed.

The controller 760 may also supply control signals to other processing system components. In some embodiments, for example, the controller 760 may supply control signals to the spinner 720 and/or the chemical supply system 746 to dry the substrate 730 after the second purge step is performed. In one example, the controller 760 may control the rotational speed of the spinner 720, so as to dry the substrate 730 in a spin dry step. In another example, control signals supplied from the controller 760 to the chemical supply system 746 may cause a drying agent (such as, e.g., isopropyl alcohol) to be dispensed onto the surface of the substrate 730 to further assist in drying the substrate before performing the spin dry step.

In some embodiments, the controller 760 may control the temperature of the etch solutions 742 dispensed onto the substrate. Etch solutions can be dispensed at various temperatures as long as the vapor pressure of the liquid is lower than the chamber pressure. For these implementations, a spinner with a liquid dispensing nozzle would be placed in a pressure vessel or a vacuum chamber. The temperature of the liquid being dispensed can be elevated to any temperature below its boiling point at the pressure of the process. In some embodiments, a surface modification solution may be dispensed onto the surface of the substrate 730 at a temperature less than or equal to room temperature (e.g., a temperature less than or equal to 25° C.), and a dissolution solution may be dispensed onto the surface of the substrate 730 at an elevated temperature (e.g., a temperature greater than 40° C. and less than a boiling point of the dissolution solution). As noted above, higher liquid temperatures can increase the kinetics of dissolution. In some embodiments, purge solutions may also be utilized to pre-heat or pre-cool the substrate prior to performing the next processing step, as shown in FIG. 3.

Figure 8:
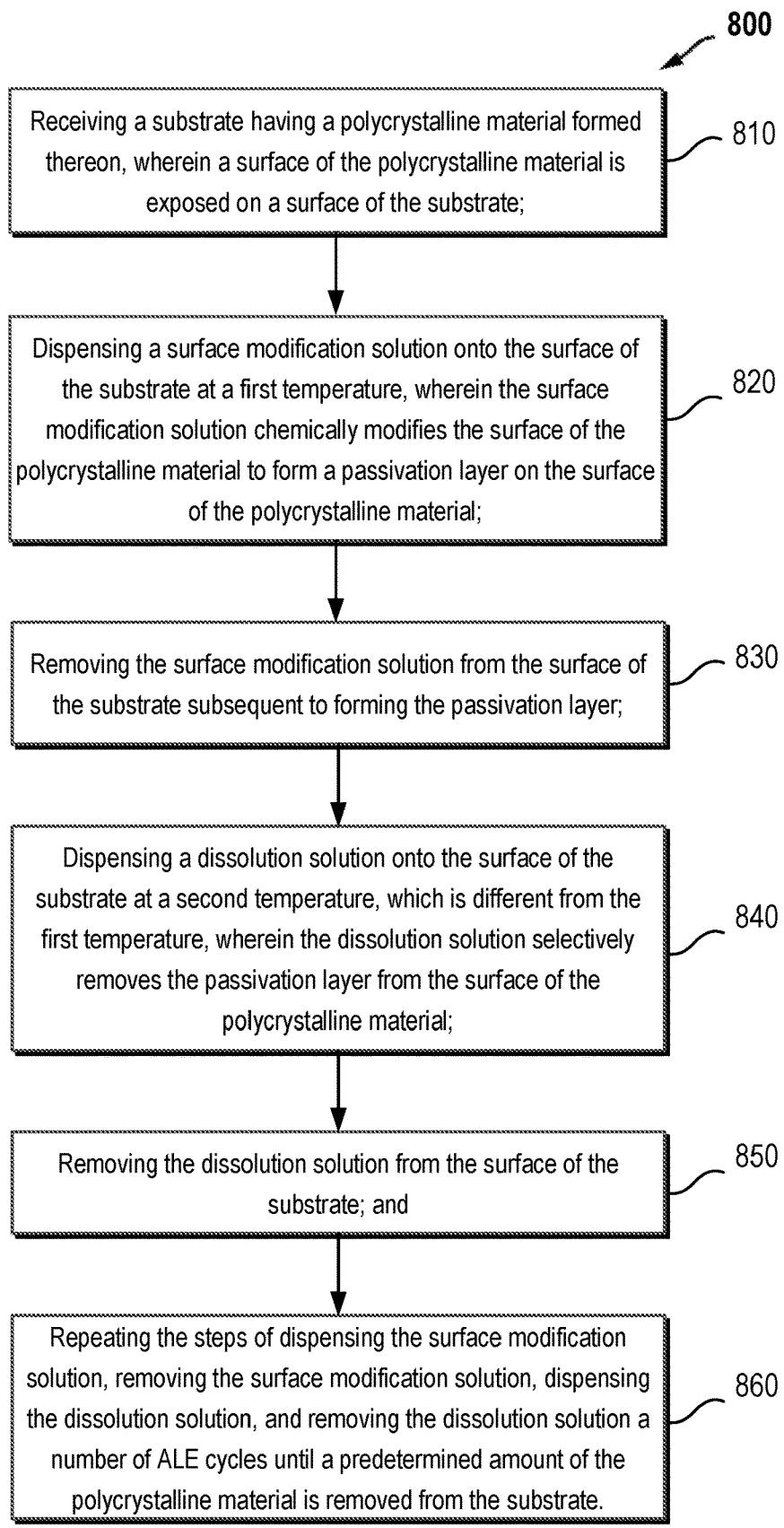
FIG. 8 is a flowchart diagram illustrating one embodiment of a method utilizing the techniques described herein.
Figure 9:
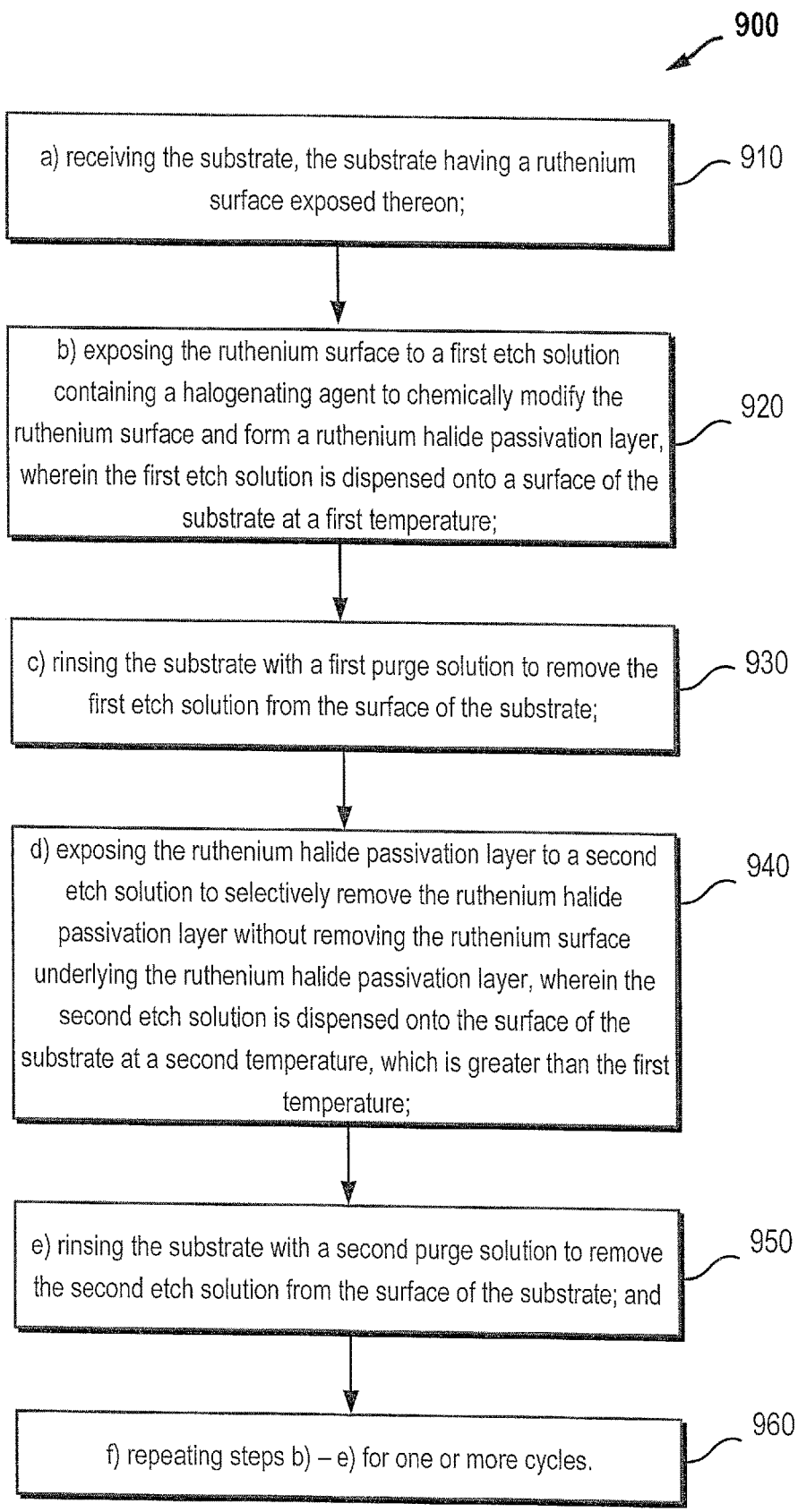
FIG. 9 is a flowchart diagram illustrating another embodiment of a method utilizing the techniques described herein.

FIGS. 8-9 illustrate exemplary methods that utilize the non-isothermal wet atomic layer etching (ALE) techniques described herein for etching various polycrystalline materials formed on a substrate. It will be recognized that the embodiments of FIGS. 8-9 are merely exemplary and additional methods may utilize the techniques described herein. Further, additional processing steps may be added to the methods shown in the FIGS. 8-9 as the steps described are not intended to be exclusive. Moreover, the order of the steps is not limited to the order shown in the figures as different orders may occur and/or various steps may be performed in combination or at the same time.

FIG. 8 illustrates one embodiment of a method 800 of etching a polycrystalline material using a non-isothermal wet atomic layer etching (ALE) process in accordance with the present disclosure. The method 800 shown in FIG. 8 may generally include receiving a substrate having a polycrystalline material formed thereon, wherein a surface of the polycrystalline material is exposed on a surface of the substrate (in step 810), and dispensing a surface modification solution onto the surface of the substrate at a first temperature, wherein the surface modification solution chemically modifies the surface of the polycrystalline material to form a passivation layer on the surface of the polycrystalline material (in step 820). The passivation layer is self-limited and insoluble to the surface modification solution. Next, the method 800 may include removing the surface modification solution from the surface of the substrate subsequent to forming the passivation layer (in step 830) and dispensing a dissolution solution onto the surface of the substrate at a second temperature, which is different from the first temperature (in step 840). The dissolution solution selectively removes the passivation layer from the surface of the polycrystalline material in step 840. Next, the method 800 may include removing the dissolution solution from the surface of the substrate (in step 850) and repeating the steps of dispensing the surface modification solution, removing the surface modification solution, dispensing the dissolution solution, and removing the dissolution solution a number of ALE cycles until a predetermined amount of the polycrystalline material is removed from the substrate (in step 860).

When utilizing the method 800 shown in FIG. 8, the first temperature and the second temperature may be selected so as to independently optimize the reactions that occur during the surface modification and dissolution steps of the non-isothermal wet ALE process. In some embodiments, for example, the surface modification solution may be dispensed (in step 820) at a first temperature, which is less than or approximately equal to room temperature. In one example, the first temperature may be selected from a first temperature range comprising 20° C. and 25° C. However, the first temperature is not strictly limited to such, and may alternatively be selected from a first temperature range having an upper limit of approximately 25° C. and a lower limit that is set by the freezing point of the surface modification solution. In some embodiments, the dissolution solution may be dispensed (in step 840) at a second temperature, which is greater than the first temperature to optimize the kinetics of the dissolution reaction. For example, the dissolution solution may be dispensed in step 840 within a second temperature range having a lower limit of 40° C. and an upper limit that is set by the boiling point of the dissolution solution.

In some embodiments, removing the surface modification solution (in step 830) may include dispensing a first purge solution onto the surface of the substrate to remove the surface modification solution from the surface of the substrate prior to dispensing the dissolution solution (in step 840). In some embodiments, a temperature of the first purge solution may bring a temperature of the substrate closer to the second temperature before the dissolution solution is dispensed (in step 840). In some embodiments, the temperature of the first purge solution may be within 10% of the second temperature.

In some embodiments, removing the dissolution solution (in step 850) may include dispensing a second purge solution onto the surface of the substrate to remove the dissolution solution from the surface of the substrate before re-dispensing the surface modification solution during a subsequent ALE cycle. In some embodiments, a temperature of the second purge solution may bring a temperature of the substrate closer to the first temperature before the surface modification solution is re-dispensed during the subsequent ALE cycle. In some embodiments, the temperature of the second purge solution may be within 10% of the first temperature.

When utilizing the method 800 shown in FIG. 8, different etch chemistries may be used within the surface modification and the dissolution solutions for etching a wide variety of polycrystalline materials, such as metals, metal oxides and silicon-based materials. Examples of metals that may be etched using the methods disclosed herein include, but are not limited to, ruthenium (Ru), cobalt (Co), copper (Cu), molybdenum (Mo), tungsten (W), gold (Au), platinum (Pt), iridium (Ir) and other transition metals. Example of metal oxides that may be etched using the methods disclosed herein include, but are not limited to, aluminum oxide ($Al_2O_3$), hafnium oxide ($HfO_2$). In some embodiments, the methods disclosed herein may also be used to etch silicon-based materials, such as but not limited to, silicon (Si), silicon oxides (e.g., SiO and $SiO_2$) and silicon nitrides (e.g., $Si_3N_4$). Although various examples are provided herein, one skilled in the art would recognize how the methods disclosed herein may be used to etch other metals, metal oxides and silicon-based materials. Example etch chemistries for etching ruthenium and molybdenum using the non-isothermal wet ALE techniques disclosed herein are discussed in more detail below.

In some embodiments, the method 800 shown in FIG. 8 may be used for etching a ruthenium (Ru) surface. When the method 800 is utilized for etching a ruthenium surface, the surface modification solution dispensed in step 820 may include a halogenation agent (e.g., a chlorination agent, a fluorinating agent or a brominating agent) dissolved in a first solvent, and the dissolution solution dispensed in step 840 may include a ligand dissolved in a second solvent. The halogenation agent included within the surface modification solution chemically modifies the ruthenium surface to form a halogenated ruthenium passivation layer. The ligand included within the dissolution solution reacts with and binds to the halogenated ruthenium passivation layer to form a soluble species, which is dissolved within the second solvent to selectively remove the halogenated ruthenium passivation layer from the ruthenium surface. In some embodiments, the surface modification solution may be dispensed in step 820 at a first temperature ranging between 20° C. and 25° C. In some embodiments, the dissolution solution may be dispensed in step 840 at an elevated temperature (e.g., a temperature greater than or equal to 40° C.) to optimize the kinetics of the dissolution reaction. For example, the dissolution solution may be dispensed in step 840 at approximately 40° C.-100° C. when aqueous dissolution solutions are used to etch ruthenium.

In other embodiments, the method 800 shown in FIG. 8 may be used for etching a molybdenum (Mo) surface. When the method disclosed herein is utilized for etching a molybdenum surface, the surface modification solution dispensed in step 820 may include an oxidation agent and a first ligand dissolved in a first solvent, and the dissolution solution dispensed in step 840 may include a second ligand dissolved in a second solvent. The oxidation agent oxidizes the molybdenum surface to form a molybdenum oxide passivation layer. The first ligand included within the surface modification solution reacts with and binds to the molybdenum oxide passivation layer to form a ligand-metal complex, which is insoluble in the first solvent. When the ligand-metal complex is exposed to the dissolution solution in step 840, a ligand exchange process exchanges the first ligand in the ligand-metal complex with the second ligand included within the dissolution solution to form a soluble species, which is dissolved within the second solvent to selectively remove the molybdenum oxide passivation layer from the molybdenum surface. In some embodiments, the surface modification solution may be dispensed in step 820 at a first temperature ranging between 20° C. and 25° C. In some embodiments, the dissolution solution may be dispensed in step 840 at an elevated temperature (e.g., a temperature greater than or equal to 40° C.) to optimize the kinetics of the dissolution reaction. For example, the dissolution solution may be dispensed in step 840 at approximately 40° C.-337° C. depending on the acidic solution used to etch molybdenum. In other embodiments, however, the surface modification solution and the dissolution solution may each be dispensed at approximately room temperature.

FIG. 9 illustrates one embodiment of a method 900 that may be used for substrate using a non-isothermal wet atomic layer etching (ALE) process in accordance with the present disclosure. The method 900 shown in FIG. 9 may generally include: a) receiving the substrate, the substrate having a ruthenium surface exposed thereon (in step 910); b) exposing the ruthenium surface to a first etch solution containing a halogenating agent to chemically modify the ruthenium surface and form a ruthenium halide passivation layer, wherein the first etch solution is dispensed onto a surface of the substrate at a first temperature (in step 920); c) rinsing the substrate with a first purge solution to remove the first etch solution from the surface of the substrate (in step 930); d) exposing the ruthenium halide passivation layer to a second etch solution to selectively remove the ruthenium halide passivation layer without removing the ruthenium surface underlying the ruthenium halide passivation layer, wherein the second etch solution is dispensed onto the surface of the substrate at a second temperature, which is greater than the first temperature (in step 940); e) rinsing the substrate with a second purge solution to remove the second etch solution from the surface of the substrate (in step 950); and f) repeating steps b)-e) for one or more cycles (in step 960).

In some embodiments, the ruthenium surface may be exposed to the first etch solution (in step 920) by dispensing the first etch solution onto a surface of the substrate at a first temperature, which is at or near room temperature. For example, the first temperature may be selected from a first temperature range comprising 20° C. to 25° C. In some embodiments, the ruthenium halide passivation layer may be exposed to the second etch solution (in step 940) by dispensing the second etch solution onto the surface of the substrate at a second temperature, which is greater than the first temperature. For example, the second temperature may be selected from a second temperature range comprising 40° C. to 100° C. to optimize the kinetics of the dissolution reaction.

In some embodiments of the method 900 shown in FIG. 9, the first etch solution may include a chlorination agent dissolved in a first solvent. In such embodiments, the chlorination agent may react with the ruthenium surface to form a ruthenium chloride passivation layer, which is insoluble in the first solvent. For example, the chlorination agent may include trichloroisocyanuric acid (TCCA), oxalyl chloride, thionyl chloride or N-chlorosuccinimide, and the first solvent may include ethyl acetate (EA), acetone, acetonitrile, or a chlorocarbon.

In some embodiments of the method 900 shown in FIG. 9, the second etch solution may include a ligand dissolved in a second solvent. In such embodiments, the ligand may react with and bind to the ruthenium chloride passivation layer to form a soluble species that dissolves within the second solvent. For example, the ligand may include ethylenediaminetetraacetic acid (EDTA), iminodiacetic acid (IDA), diethylenetriaminepentaacetic acid (DTPA) or acetylacetone (ACAC), and the second solvent may include a base.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the ruthenium wet ALE techniques are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

What is claimed is:

1. A method for etching a polycrystalline material using a non-isothermal wet atomic layer etching (ALE) process, the method comprising:
    receiving a substrate having a polycrystalline material formed thereon, wherein a surface of the polycrystalline material is exposed on a surface of the substrate;
    dispensing a surface modification solution at a first temperature onto the surface of the substrate, wherein the surface modification solution chemically modifies the surface of the polycrystalline material to form a passivation layer on the surface of the polycrystalline material;
    removing the surface modification solution from the surface of the substrate subsequent to forming the passivation layer;
    heating a dissolution solution to a second temperature, which is greater than the first temperature, prior to dispensing the dissolution solution onto the surface of the substrate;
    dispensing the dissolution solution heated to the second temperature onto the surface of the substrate, wherein the dissolution solution selectively removes the passivation layer from the surface of the polycrystalline material;
    removing the dissolution solution from the surface of the substrate; and
    repeating the steps of dispensing the surface modification solution, removing the surface modification solution, dispensing the dissolution solution, and removing the dissolution solution a number of ALE cycles until a predetermined amount of the polycrystalline material is removed from the substrate.

2. The method of claim 1, wherein the first temperature is selected from a first temperature range having a lower limit that is set by a freezing point of the surface modification solution and an upper limit of 25° C.

3. The method of claim 1, wherein the first temperature is selected from a first temperature range comprising 20° C. to 25° C.

4. The method of claim 1, wherein the second temperature is selected from a second temperature range having a lower limit of 40° C. and an upper limit that is set by a boiling point of the dissolution solution.

5. The method of claim 1, wherein the second temperature is selected from a second temperature range comprising 40° C. to 337° C.

6. The method of claim 1, wherein the polycrystalline material comprises a transition metal, a transition metal oxide or a silicon-based material.

7. The method of claim 1, wherein said removing the surface modification solution comprises dispensing a first purge solution onto the surface of the substrate to remove the surface modification solution from the surface of the substrate prior to dispensing the dissolution solution, and wherein a temperature of the first purge solution brings a temperature of the substrate closer to the second temperature before the dissolution solution is dispensed.

8. The method of claim 7, wherein the temperature of the first purge solution is within 10% of the second temperature.

9. The method of claim 1, wherein said removing the dissolution solution comprises dispensing a second purge solution onto the surface of the substrate to remove the dissolution solution from the surface of the substrate before re-dispensing the surface modification solution during a subsequent ALE cycle, and wherein a temperature of the second purge solution brings a temperature of the substrate closer to the first temperature before the surface modification solution is re-dispensed during the subsequent ALE cycle.

10. The method of claim 9, the temperature of the second purge solution is within 10% of the first temperature.

11. The method of claim 1, wherein the polycrystalline material comprises a ruthenium surface, wherein said dispensing the surface modification solution comprises dispensing a halogenation agent dissolved in a first solvent onto the surface of the substrate at the first temperature ranging between 20° C. and 25° C., and wherein the halogenation agent chemically modifies the ruthenium surface to form a halogenated ruthenium passivation layer.

12. The method of claim 11, wherein said dispensing the dissolution solution comprises dispensing a ligand dissolved in a second solvent onto the surface of the substrate at the second temperature ranging between 40° C. and 100° C., wherein the ligand reacts with and binds to the halogenated ruthenium passivation layer to form a soluble species, which is dissolved within the second solvent to selectively remove the halogenated ruthenium passivation layer from the ruthenium surface.

13. The method of claim 1, wherein the polycrystalline material comprises a molybdenum surface, wherein said dispensing the surface modification solution comprises dispensing an oxidation agent and a first ligand dissolved in a first solvent onto the surface of the substrate at the first temperature ranging between 20° C. and 25° C., wherein the oxidation agent oxidizes the molybdenum surface to form a molybdenum oxide passivation layer, and wherein the first ligand reacts with and binds to the molybdenum oxide passivation layer to form a ligand-metal complex, which is insoluble in the first solvent.

14. The method of claim 13, wherein said dispensing the dissolution solution comprises dispensing a second ligand dissolved in a second solvent onto the surface of the substrate at the second temperature ranging between 40° C. and 337° C., wherein when the ligand-metal complex is exposed to the dissolution solution, a ligand exchange process exchanges the first ligand in the ligand-metal complex with the second ligand included within the dissolution solution to form a soluble species, which is dissolved within the second solvent to selectively remove the molybdenum oxide passivation layer from the molybdenum surface.

15. A method of etching a substrate using a non-isothermal wet atomic layer etching (ALE) process, the method comprising:
a) receiving the substrate, the substrate having a ruthenium surface exposed thereon;
b) exposing the ruthenium surface to a first etch solution containing a halogenating agent to chemically modify the ruthenium surface and form a ruthenium halide passivation layer, wherein the first etch solution is dispensed at a first temperature onto a surface of the substrate;
c) rinsing the substrate with a first purge solution to remove the first etch solution from the surface of the substrate;
d) exposing the ruthenium halide passivation layer to a second etch solution to selectively remove the ruthenium halide passivation layer without removing the ruthenium surface underlying the ruthenium halide passivation layer, wherein the second etch solution is heated to a second temperature, which is greater than the first temperature, before the second etch solution is dispensed onto the surface of the substrate at the second temperature;
e) rinsing the substrate with a second purge solution to remove the second etch solution from the surface of the substrate; and
f) repeating steps b)-e) for one or more cycles.

16. The method of claim 15, wherein the first temperature is selected from a temperature range comprising 20° C. to 25° C.

17. The method of claim 15, wherein the second temperature is selected from a temperature range comprising 40° C. to 100° C.

18. The method of claim 15, wherein the first etch solution includes a chlorination agent dissolved in a first solvent, wherein the chlorination agent reacts with the ruthenium surface to form a ruthenium chloride passivation layer, which is insoluble in the first solvent.

19. The method of claim 18, wherein the chlorination agent comprises trichloroisocyanuric acid (TCCA), oxalyl chloride, thionyl chloride or N-chlorosuccinimide, and wherein the first solvent comprises ethyl acetate (EA), acetone, acetonitrile, or a chlorocarbon.

20. The method of claim 18, wherein the second etch solution includes a ligand dissolved in a second solvent, wherein the ligand reacts with and binds to the ruthenium chloride passivation layer to form a soluble species that dissolves within the second solvent.

21. The method of claim 20, wherein the ligand comprises ethylenediaminetetraacetic acid (EDTA), iminodiacetic acid (IDA), diethylenetriaminepentaacetic acid (DTPA) or acetylacetone (ACAC), and wherein the second solvent comprises a base.

* * * * *